United States Patent
Tanaka

(10) Patent No.: US 10,756,752 B2
(45) Date of Patent: *Aug. 25, 2020

(54) CIRCUIT DEVICE, VIBRATION DEVICE, ELECTRONIC APPARATUS, AND VEHICLE

(71) Applicant: Seiko Epson Corporation, Tokyo (JP)

(72) Inventor: Atsushi Tanaka, Minowa (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/227,494

(22) Filed: Dec. 20, 2018

(65) Prior Publication Data

US 2019/0207622 A1    Jul. 4, 2019

(30) Foreign Application Priority Data

Dec. 28, 2017 (JP) ................. 2017-254044

(51) Int. Cl.

| H03M 3/00 | (2006.01) |
|---|---|
| H03L 1/02 | (2006.01) |
| H03F 3/45 | (2006.01) |
| H03M 1/80 | (2006.01) |

(52) U.S. Cl.
CPC ........... *H03M 3/464* (2013.01); *H03F 3/45* (2013.01); *H03F 3/45475* (2013.01); *H03L 1/022* (2013.01); *H03M 1/804* (2013.01); *H03M 3/426* (2013.01); *H03M 3/474* (2013.01); *H03F 2203/45156* (2013.01); *H03F 2203/45512* (2013.01)

(58) Field of Classification Search
CPC .............. H03M 3/464; H03M 1/804; H03F 2203/45156; H03F 2203/45551
See application file for complete search history.

(56) References Cited

U.S. PATENT DOCUMENTS

| 2011/0260899 A1 | 10/2011 | Snedeker | |
|---|---|---|---|
| 2012/0280846 A1 | 11/2012 | Lin | |
| 2015/0263756 A1* | 9/2015 | Chiu | H03M 1/468 341/118 |
| 2018/0219558 A1 | 8/2018 | Chiu et al. | |
| 2019/0207621 A1* | 7/2019 | Tanaka | H03M 3/474 |

FOREIGN PATENT DOCUMENTS

JP           11-004166 A        1/1999

* cited by examiner

*Primary Examiner* — Jeffrey M Shin
(74) *Attorney, Agent, or Firm* — Harness, Dickey & Pierce, P.L.C.

(57) ABSTRACT

A circuit device includes a selector to which first to n-th voltages are input, an A/D converter circuit to which output voltages of the selector are input as input voltages, and first to n-th quantization error hold circuits that hold charges corresponding to quantization errors in A/D conversion of the first to n-th voltages. The A/D converter circuit performs A/D conversion of an input voltage by a successive approximation operation using a charge redistribution type D/A converter circuit and performs k-th A/D conversion on an i-th voltage by using a charge held in an i-th quantization error hold circuit in (k−1)th A/D conversion of the i-th voltage to output A/D conversion result data DOUT in which the quantization error is noise-shaped.

11 Claims, 11 Drawing Sheets

CIRCUIT DEVICE, VIBRATION DEVICE, ELECTRONIC APPARATUS, AND VEHICLE

BACKGROUND

1. Technical Field

The present invention relates to a circuit device, a vibration device, an electronic apparatus, a vehicle, and the like.

2. Related Art

Successive approximation type A/D converter circuits that perform A/D conversion on an input signal by comparing the voltage of the input signal with the D/A converted voltage of the successive approximation data, updating the successive approximation data based on the comparison result, and repeatedly performing this comparison and updating by a technique such as a binary search or the like have been known in the related art. While the successive approximation type A/D converter circuit has low power consumption, it is difficult to increase the accuracy (for example, to increase the number of valid bits) as compared with, for example, a delta sigma type A/D converter circuit or the like.

As a technique for increasing the accuracy of the successive approximation type A/D converter circuit, for example, there is a technique disclosed in JP-A-11-4166. In JP-A-11-4166, a hybrid type A/D converter circuit is configured by adopting a delta sigma type configuration in the successive approximation type A/D converter circuit, and quantization noise in a low frequency band is reduced by a noise shaping effect to achieve high accuracy.

In a case where a plurality of input signals are input to an A/D converter circuit, an A/D converter circuit corresponding to multichannel input is necessary. In a successive approximation type A/D converter circuit which is not a hybrid type, it is possible to realize an A/D converter circuit for multichannel input by performing A/D conversion on a plurality of input signals in a time division manner. However, the hybrid type A/D converter circuit of the related art, incorporating a delta sigma type configuration for high accuracy does not support multichannel input. For example, the above-described JP-A-11-4166 discloses a hybrid A/D converter circuit having only one channel input. For this reason, in the hybrid type A/D converter circuit of the related art, it was not possible to achieve both high accuracy of A/D conversion and multichannel input.

SUMMARY

An advantage of some aspects of the invention is to solve at least a part of the problems described above, and the invention can be implemented as the following forms or embodiments.

An aspect of the invention relates to a circuit device including a selector to which first to n-th voltages (n is an integer of 2 or more) are input, an A/D converter circuit that includes a charge redistribution type D/A converter circuit and receives an output voltage of the selector as an input voltage to perform A/D conversion of the input voltage by a successive approximation operation using the D/A converter circuit, and first to n-th quantization error hold circuits that hold charges corresponding to quantization errors in the A/D conversion of the first to n-th voltages, in which the A/D converter circuit uses a charge held in an i-th quantization error hold circuit as a charge corresponding to a quantization error in (k−1) th (k is an integer of 2 or more) A/D conversion of an i-th voltage (i is an integer from 1 to n) to perform k-th A/D conversion on the i-th voltage, and outputs A/D conversion result data in which the quantization error is noise-shaped.

According to the aspect of the invention, by performing the A/D conversion of the i-th voltage by a successive approximation operation using a charge redistribution type D/A converter circuit, after the successive approximation operation is completed, the D/A converter circuit may output a voltage corresponding to the quantization error in the (k−1)th A/D conversion for the i-th voltage. The i-th quantization error hold circuit holds a charge based on the voltage, whereby it is possible to hold the voltage corresponding to the quantization error in the (k−1)th A/D conversion with respect to the i-th voltage. It is possible to perform noise shaping of the quantization error by using this charge to perform the k-th A/D conversion on the i-th voltage. In the aspect of the invention, it is possible to cope with multichannel input by providing a quantization error hold circuit corresponding to each channel. As described above, it is possible to achieve both high accuracy of A/D conversion by the noise shaping effect and multichannel input.

In the aspect of the invention, the A/D converter circuit may include an adder circuit that outputs a voltage obtained by subtracting a voltage corresponding to the charges held in the i-th quantization error hold circuit from a voltage corresponding to the input voltage, the D/A converter circuit may output a differential voltage between the output voltage of the adder circuit and the D/A converted voltage of successive approximation data, and the i-th quantization error hold circuit may hold a charge corresponding to the differential voltage after the successive approximation operation for the i-th voltage is completed.

According to the aspect of the invention with this configuration, a target of successive approximation is an output voltage of the adder circuit. This output voltage is a voltage obtained by subtracting a voltage corresponding to a charge held in an i-th quantization error hold circuit from a voltage corresponding to an input voltage. That is, a quantization error is fed back to an i-th voltage by the i-th quantization error hold circuit. As a result, it is possible to realize a hybrid type A/D converter circuit incorporating a delta sigma type configuration.

In the aspect of the invention, the A/D converter circuit may include a comparator circuit that makes a comparison determination between the output voltage of the adder circuit and the D/A converted voltage of the successive approximation data based on the differential voltage from the D/A converter circuit, and a control circuit that updates the successive approximation data based on the comparison result by the comparator circuit to output the successive approximation data to the D/A converter circuit.

According to the aspect of the invention with this configuration, it is possible to realize A/D conversion of the input voltage by successive approximation using the charge redistribution type D/A converter circuit. That is, it is possible to realize the successive approximation operation by updating successive approximation data based on the comparison determination between the output voltage of the adder circuit and the D/A converted voltage of the successive approximation data, outputting the updated successive approximation data to the D/A converter circuit, and sequentially repeating the operations to determine A/D conversion result data. In the aspect of the invention with the configuration described above, since the quantization error is fed back to the i-th voltage by the i-th quantization error hold circuit, it is possible to realize a hybrid type A/D converter circuit incorporating a delta sigma configuration.

In the aspect of the invention, the D/A converter circuit may be a differential D/A converter circuit having a capacitor array circuit on the positive electrode side and a capacitor array circuit on the negative electrode side, in which the adder circuit may include a fully differential operational amplifier, a feedback capacitor on the positive electrode side that is provided between an inverting output node and a non-inverting input node of the operational amplifier, and a feedback capacitor on the negative electrode side that is provided between a non-inverting output node and an inverting input node of the operational amplifier, the i-th quantization error hold circuit may include a hold circuit on the positive electrode side and a hold circuit on the negative electrode side, the hold circuit on the positive electrode side may include a hold capacitor on the positive electrode side, a first switch on the positive electrode side that connects one end of the hold capacitor on the positive electrode side to any one of a sampling node of the capacitor array on the positive electrode side and a node of a common voltage, and a second switch on the positive electrode side that connects the other end of the hold capacitor on the positive electrode side to any one of the node of the common voltage and the inverting input node, and the hold circuit on the negative electrode side may include a hold capacitor on the negative electrode side, a first switch on the negative electrode side that connects one end of the hold capacitor on the negative electrode side to any one of a sampling node of the capacitor array on the negative electrode side and the node of the common voltage, and a second switch on the negative electrode side that connects the other end of the hold capacitor on the negative electrode side to any one of the node of the common voltage and the non-inverting input node.

According to the aspect of the invention with this configuration, the first switch on the positive electrode side connects one end of the hold capacitor on the positive electrode side to the sampling node of the capacitor array on the positive electrode side and the second switch on the positive electrode side connects the other end of the hold capacitor on the positive electrode side to the node of the common voltage, whereby the hold capacitor on the positive electrode side may hold the charge corresponding to the quantization error. The first switch on the negative electrode side connects one end of the hold capacitor on the negative electrode side to the sampling node of the capacitor array on the negative electrode side and the second switch on the negative electrode side connects the other end of the hold capacitor on the negative electrode side to the node of the common voltage, whereby the hold capacitor on the negative electrode side may hold the charge corresponding to the quantization error. The first switch on the positive electrode side connects one end of the hold capacitor on the positive electrode side to the node of the common voltage and the second switch on the positive electrode side connects the other end of the hold capacitor on the positive electrode side to the inverting input node of the operational amplifier, whereby the charge held by the hold capacitor on the positive electrode side is redistributed between the hold capacitor on the positive electrode side and the feedback capacitor on the negative electrode side. The first switch on the negative electrode side connects one end of the hold capacitor on the negative electrode side to the node of the common voltage and the second switch on the negative electrode side connects the other end of the hold capacitor on the negative electrode side to the non-inverting input node of the operational amplifier, whereby the charge held by the hold capacitor on the negative electrode side is redistributed between the hold capacitor on the negative electrode side and the feedback capacitor on the positive electrode side. As a result, it is possible to subtract the voltage corresponding to the quantization error from the input voltage of the A/D converter circuit.

In the aspect of the invention, the adder circuit may include a fully differential operational amplifier, a chopping modulation circuit that performs chopping modulation on voltages input to a non-inverting input node and an inverting input node of the operational amplifier, and a chopping demodulation circuit that performs chopping demodulation on voltages output from the inverting output node and the non-inverting output node of the operational amplifier.

In the aspect of the invention with this configuration, since the present embodiment has a noise shaping mechanism, when a DC signal is input to the A/D converter circuit, the A/D conversion result data has a specific time change pattern, and unnecessary frequency components may be generated in the A/D conversion result data. This phenomenon is called an idle tone. According to the aspect of the invention with the configuration described above, the change in the A/D conversion result data due to the offset of the operational amplifier becomes a high frequency by the frequency of the chopping, and the idle tone as described above may be reduced.

In the aspect of the invention, the circuit device may include a processing circuit that outputs frequency control data based on the A/D conversion result data corresponding to the input voltage which is a temperature detection voltage and an oscillation signal generator circuit that generates an oscillation signal of an oscillation frequency corresponding to the frequency control data by using a vibrator.

Since the change in temperature is gentle, the signal band of the temperature detection voltage becomes a low frequency band. Therefore, even with a comparatively low speed A/D converter circuit such as the successive approximation type, it is possible to perform A/D conversion with a sufficiently higher conversion rate than the signal band. In the aspect of the invention with the configuration described above, it is possible to realize A/D conversion accompanied by the noise shaping effect as described above and to measure high S/N in the signal band of the temperature sensor by constructing a hybrid type A/D converter circuit.

In the aspect of the invention, first to m-th temperature detection voltages from the first to m-th temperature sensors (m is an integer from 1 to n) are input to the selector as first to m-th voltages of the first to n-th voltages.

As processing using temperature detection data (A/D conversion result data of temperature detection voltage), various processing in the vibration device may be assumed. Temperature compensation processing of an oscillation frequency in a digital oscillator such as a TCXO or an OCXO may be considered. Alternatively, processing for correcting a temperature-dependent error in a physical quantity measurement apparatus (for example, zero point correction in a gyro sensor) may be considered. At this time, there is a possibility that the temperature of the vibrator is estimated with high accuracy by providing a plurality of temperature sensors at a plurality of positions of the oscillator and the physical quantity measurement apparatus. In the aspect of the invention with the configuration described above, since it is possible to construct a hybrid A/D converter circuit compatible with multichannel input, it is possible to perform A/D conversion with high accuracy (highly accurate temperature detection) for the multichannel input from the plurality of temperature sensors.

Another aspect of the invention relates to a vibration device including any of the circuit devices described above and a vibrator that is connected to the circuit device.

In the aspect of the invention, the vibration device may include first to m-th temperature sensors (m is an integer of 1 to n), and first to m-th temperature detection voltages from the first to m-th temperature sensors may be input to the selector as first to m-th voltages of the first to n-th voltages.

Still another aspect of the invention relates to an electronic apparatus including the circuit device according to any of the above.

Still another aspect of the invention relates to a vehicle including any of the circuit devices described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail. The present embodiment described below does not unduly limit the contents of the invention described in the appended claims, and not all of the configurations described in the embodiment are necessarily indispensable as a solving means of the invention.

1. First Configuration Example of Circuit Device

Figure 1:
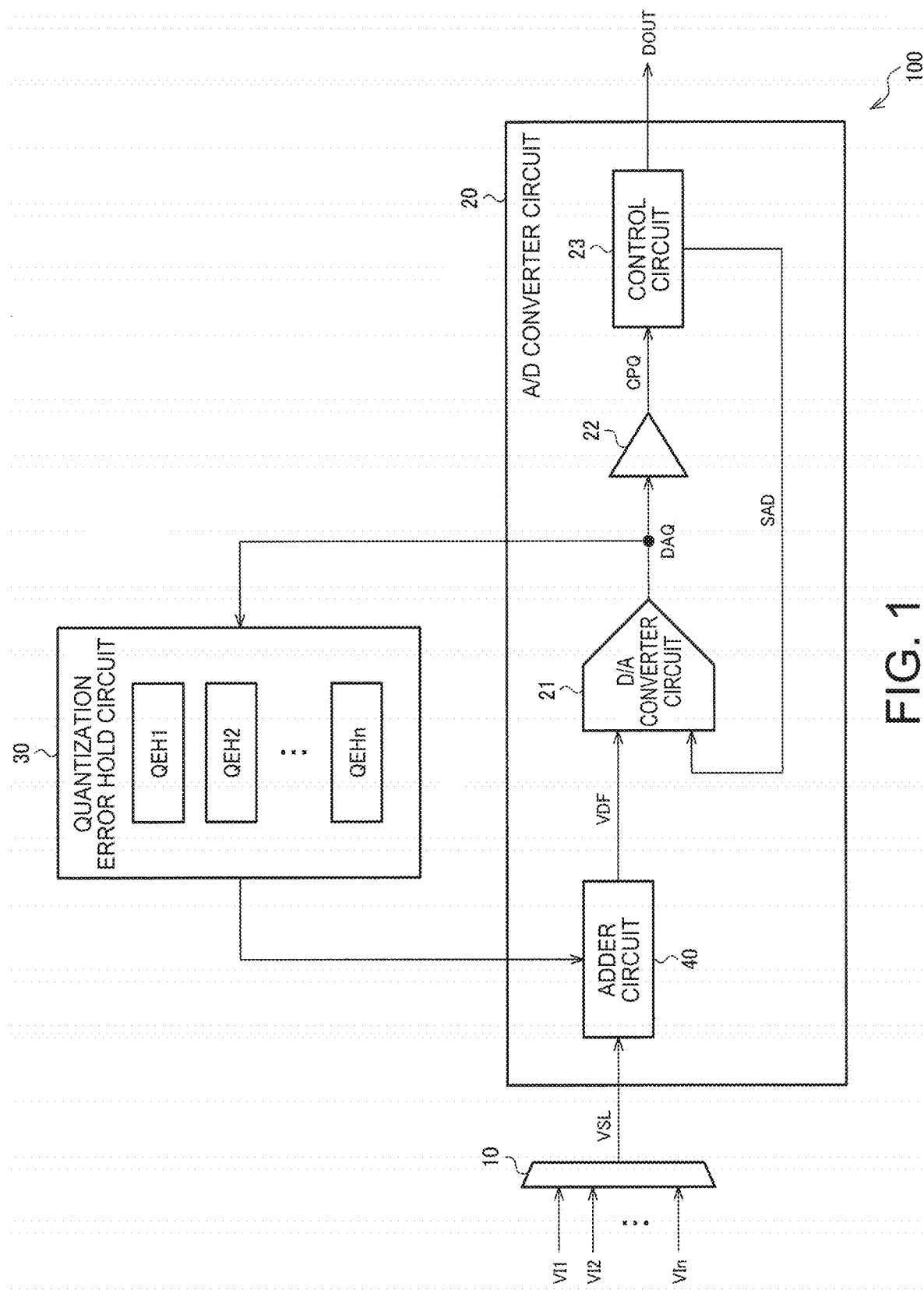
FIG. 1 is a configuration example of a circuit device.

FIG. 1 shows a configuration example of a circuit device 100. The circuit device 100 includes a selector 10, an A/D converter circuit 20, and a quantization error hold circuit 30. Further, the circuit device 100 may include an adder circuit 40.

Voltages VI1 to VIn (first to n-th voltages (n is an integer of 2 or more)) are input to the selector 10, and the selector 10 selects any one of the voltages VI1 to VIn to output the voltage as an output voltage VSL. Specifically, the selector 10 sequentially selects the voltages VI1 to VIn in a time division manner to output the voltage selected for the time division as an output voltage VSL. The voltages VI1 to VIn are voltages to be subjected to A/D conversion and are, for example, output voltage signals of the sensor.

The output voltage VSL of the selector 10 is input to the A/D converter circuit 20 as an input voltage. The A/D converter circuit 20 performs A/D conversion of the input voltage by successive comparison using a charge redistribution type D/A converter circuit 21 and outputs A/D conversion result data DOUT corresponding to the input voltage. The D/A converter circuit 21 performs D/A conversion of successive approximation data SAD by charge redistribution between capacitors based on the successive approximation data SAD. The D/A converter circuit 21 outputs the difference between the D/A converted voltage of the successive approximation data SAD and a voltage to be successively compared (VDF) as a D/A conversion result (DAQ).

The quantization error hold circuit 30 is constructed of quantization error hold circuits QEH1 to QEHn that hold charges corresponding to quantization errors in A/D conversion of the voltages VI1 to VIn. Specifically, a charge corresponding to a quantization error in the A/D conversion when the selector 10 selects the voltage VIi (an i-th voltage (i is an integer from 1 to n)) is held by the quantization error hold circuit QEHi (an i-th quantization error hold circuit). The quantization error is the difference between the voltage (VDF) to be successively compared and the D/A converted voltage of the A/D conversion result data DOUT and is the output voltage (DAQ) of the D/A converter circuit 21 when SAD=DOUT is input to the D/A converter circuit 21. The quantization error hold circuit QEHi holds a charge corresponding to a quantization error by holding the output voltage of the D/A converter circuit 21 with the capacitor.

The A/D converter circuit 20 uses the charge held in the quantization error hold circuit QEHi as charge corresponding to the quantization error in (k−1)th (k is an integer) A/D conversion of the voltage VIi to perform k-th A/D conversion on the voltage VIi. Then, the A/D converter circuit 20 outputs the A/D conversion result data DOUT corresponding to the voltage VIi, in which the quantization error is noise-shaped. That is, when the selector 10 selects the voltage VIi, and when the quantization error hold circuit QEHi holds the charge corresponding to the quantization error and then the selector 10 selects the voltage VIi, A/D conversion is performed on the input voltage (VSL) by using the charge held by the quantization error hold circuit QEHi. The A/D converter circuit 20 obtains the A/D conversion result data DOUT corresponding to the difference voltage between the input voltage and the voltage corresponding to the charge held by the quantization error hold circuit QEHi. As a result, a primary noise shaping effect is achieved with respect to the quantization error.

According to the above embodiment, it is possible to obtain the A/D conversion result data DOUT corresponding to the voltage VIi, in which the quantization error in the A/D conversion is noise-shaped. That is, it is possible to realize a hybrid type A/D converter circuit incorporating a delta sigma type configuration in the successive approximation type A/D converter circuit.

In addition, it is possible to realize multichannel input in the hybrid type A/D converter circuit by providing the quantization error hold circuit QEH1 to QEHn that hold the charges corresponding to the quantization errors in the A/D conversion of the voltages VI1 to VIn. Specifically, since the charge redistribution type D/A converter circuit 21 performs the successive approximation operation so that the voltage to be successively compared and the D/A converted voltage of the successive approximation data SAD are equal, after the successive approximation operation is completed, a voltage corresponding to the quantization error may be output to the D/A converter circuit 21. By the voltage corresponding to this quantization error, the charge corresponding to the quantization error may be held. It is possible to hold the charges corresponding to the quantization errors for each channel in the quantization error hold circuit QEH1 to QEHn by holding charges for each of the voltages VI1 to VIn.

A more detailed configuration of the A/D converter circuit 20 will be described below. The A/D converter circuit 20 includes the adder circuit 40, a D/A converter circuit 21, a comparator circuit 22 (comparator), and a control circuit 23 (logic circuit).

The adder circuit 40 outputs the voltage (VDF) obtained by subtracting the voltage corresponding to the charge held in the quantization error hold circuit QEHi from the voltage corresponding to the input voltage (VSL) to the D/A converter circuit 21. For example, the input voltage (VSL) and the voltage corresponding to the charge held in the quantization error hold circuit QEHi are added to the opposite sign (for example, multiplied by −1). The voltages corresponding to the charges held in the quantization error hold circuit QEHi are the output voltage (DAQ) of the D/A converter circuit 21 after the successive approximation operation is completed in the previous A/D conversion of the voltage VIi.

The D/A converter circuit 21 outputs the differential voltage DAQ between the output voltage VDF of the adder circuit 40 and the D/A converted voltage of the successive approximation data SAD. Specifically, the D/A converter circuit 21 samples and holds the output voltage VDF of the adder circuit 40 and performs D/A conversion on the successive approximation data SAD by charge redistribution. As a result, the differential voltages DAQ obtained by subtracting the output voltages VDF of the adder circuit 40 from the D/A converted voltage of the successive approximation data SAD are output.

The quantization error hold circuit QEHi holds a charge corresponding to the differential voltage DAQ after the successive approximation operation on the voltage VIi is completed. For example, the charge charged in the capacitor is held by the potential difference between the common voltage and the differential voltage DAQ by holding the differential voltage DAQ with the capacitors with reference to the common voltage (given voltage).

In the above configuration, the output voltage (DAQ) of the D/A converter circuit 21 becomes a residual voltage due to the quantization error by setting SAD=DOUT after the successive approximation operation is completed. The quantization error hold circuit QEHi may hold the charge corresponding to the quantization error only by holding a charge corresponding to the residual voltage. By using the charge, feedback of the residual voltage due to the quantization error to the input side enables noise shaping of the quantization error. In the configuration of the present embodiment, since the residual voltage due to the quantization error is influenced by the past residual voltage, an operation corresponding to integration in the delta sigma operation is realized, and there is no need to provide an integrator. Therefore, when dealing with the multichannel input, it suffices to provide only quantization error hold circuits for the number of channels. Since it is unnecessary to provide an integrator (amplifier) for the number of channels, it is possible to reduce an increase in power consumption and an increase in circuit scale due to the multichannel input.

The comparator circuit 22 makes a comparison determination between the output voltage VDF of the adder circuit 40 and the D/A converted voltage of the successive approximation data SAD based on the differential voltage DAQ from the D/A converter circuit 21. For example, in a case where the differential voltage DAQ is a single-ended output, the comparator circuit 22 determines the magnitude of the differential voltage DAQ with respect to a reference voltage (voltage indicating a difference zero) and outputs the determination result as a signal CPQ. Alternatively, in a case where the differential voltage DAQ is a differential output, the comparator circuit 22 determines whether the differential voltage DAQ (differential voltage signal) is positive or negative and outputs the determination result as the signal CPQ.

The control circuit 23 updates the successive approximation data SAD based on the comparison result (CPQ) by the comparator circuit 22 and outputs the updated successive approximation data SAD to the D/A converter circuit 21. Specifically, the control circuit 23 includes a register for storing the successive approximation data SAD. The control circuit 23 sets the successive approximation data SAD for comparison in the register, outputs the successive approximation data SAD for comparison to the D/A converter circuit 21, and determines the successive approximation data SAD based on the comparison result by the comparator circuit 22 at that time. As a single comparison operation, the successive approximation data SAD of the register is sequentially updated by a technique such as a binary search or the like, and the A/D conversion result data DOUT is determined when this successive approximation operation is completed. The control circuit 23 sets the A/D conversion result data DOUT in the register to output SAD=DOUT to the D/A converter circuit 21.

According to the above configuration, it is possible to realize A/D conversion of the input voltage by successive approximation using the charge redistribution type D/A converter circuit 21. The target of successive approximation is the output voltage VDF of the adder circuit 40, and the output voltage VDF is a voltage obtained by feeding back the quantization error by the quantization error hold circuit QEHi. As a result, a hybrid type A/D converter circuit incorporating a delta sigma type configuration is realized.

Figure 2:
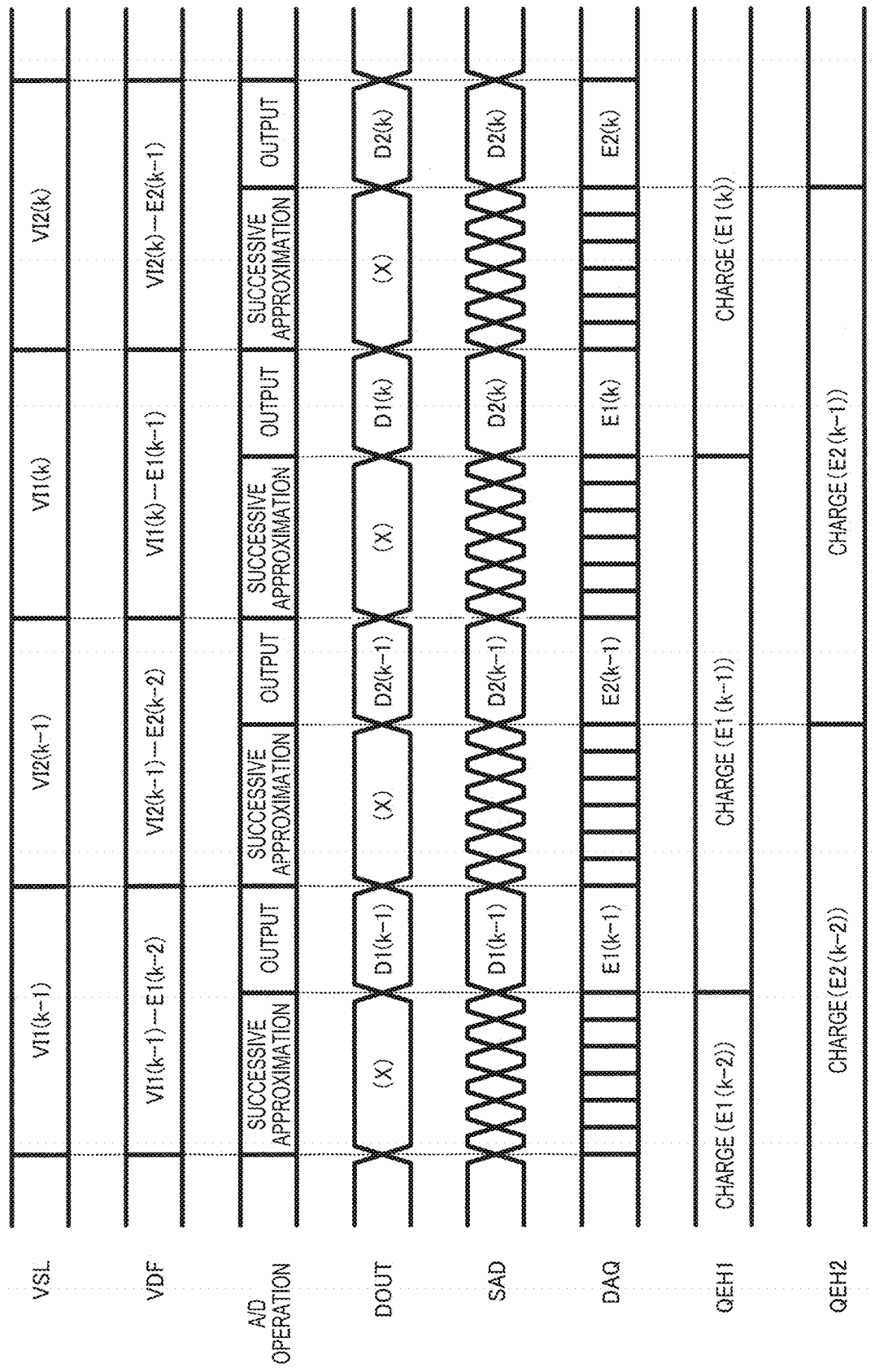
FIG. 2 is a timing chart for describing a basic operation of the circuit device.

FIG. 2 is a timing chart for describing the basic operation of the circuit device 100 in FIG. 1. Hereinafter, the case where n=2 will be described, but is not limited to n=2. In addition to the operation of FIG. 2, a reset operation and a sampling operation of the adder circuit 40, a reset operation and a sampling operation of the quantization error hold circuits QEH1 and QEH2, and the like may be further included.

In a first period of the (k−1) th A/D conversion, the selector 10 selects the voltage VI1 as the voltage VSL, and the adder circuit 40 samples and holds the voltage VSL=VI1. It is assumed that this held voltage is VI1(k−1). The quantization error hold circuit QEH1 holds a charge corresponding to the output voltage (E1(k−2)) of the D/A converter circuit 21 after the successive approximation operation is completed in (k−2)th A/D conversion. The adder circuit 40 outputs VDF=VI (k−1)−E1 (k−2) based on the charge. Here, the gain of the adder circuit 40 with respect to the voltage VSL is 1, but the gain is not limited to 1. The D/A converter circuit 21, the comparator circuit 22, and the control circuit 23 perform the successive approximation operation to perform A/D conversion on the output voltage VDF of the adder circuit 40 and output A/D conversion result data DOUT=D1(k–1). (X) of DOUT indicates do not care. The control circuit 23 outputs SAD=D1(k–1), the D/A converter circuit 21 outputs a voltage E1(k–1) corresponding to the quantization error, and the quantization error hold circuit QEH1 holds the charge corresponding to the voltage E1(k–1).

Next, in a second period of the (k–1)th A/D conversion, the selector 10 selects a voltage VI2 as the voltage VSL, and the adder circuit 40 samples and holds the voltage VSL=VI2. It is assumed that this held voltage is VI2(k–1). By the same operation as above, the D/A converter circuit 21 outputs a voltage E2(k–1) corresponding to the quantization error, and the quantization error hold circuit QEH2 holds the charge corresponding to the voltage E2(k–1).

Next, in a first period of the k-th A/D conversion, the selector 10 selects the voltage VI1 as the voltage VSL, and the adder circuit 40 samples and holds the voltage VSL=VI1. It is assumed that this held voltage is VI1(k). By the same operation as above, the D/A converter circuit 21 outputs a voltage E1(k) corresponding to a quantization error, and the quantization error hold circuit QEH1 holds the charge corresponding to the voltage E1(k).

Next, in a second period of the k-th A/D conversion, the selector 10 selects the voltage VI2 as the voltage VSL, and the adder circuit 40 samples and holds the voltage VSL=VI2. It is assumed that this held voltage is VI2(k). By the same operation as above, the D/A converter circuit 21 outputs a voltage E2(k) corresponding to a quantization error, and the quantization error hold circuit QEH2 holds the charge corresponding to the voltage E2(k). Hereinafter, the same operation is repeated for the (k+1)th and subsequent A/D conversion.

The transfer function realized by the above operation is shown in the following equation (1). V(Di) represents the A/D conversion result data DOUT=Di of the voltage VIi by voltage, specifically, the D/A converted voltage of Di. In the following equation (1), the effect of a primary high-pass filter $(1-z^{-1})$ is achieved with respect to a voltage Ei which is a quantization error. That is, in the A/D conversion result data DOUT=Di, the primary noise shaping effect is achieved with respect to the noise due to the quantization error.

$$V(Di)=VIi+(1-z^{-1})\times Ei \qquad (1)$$

Figure 3:
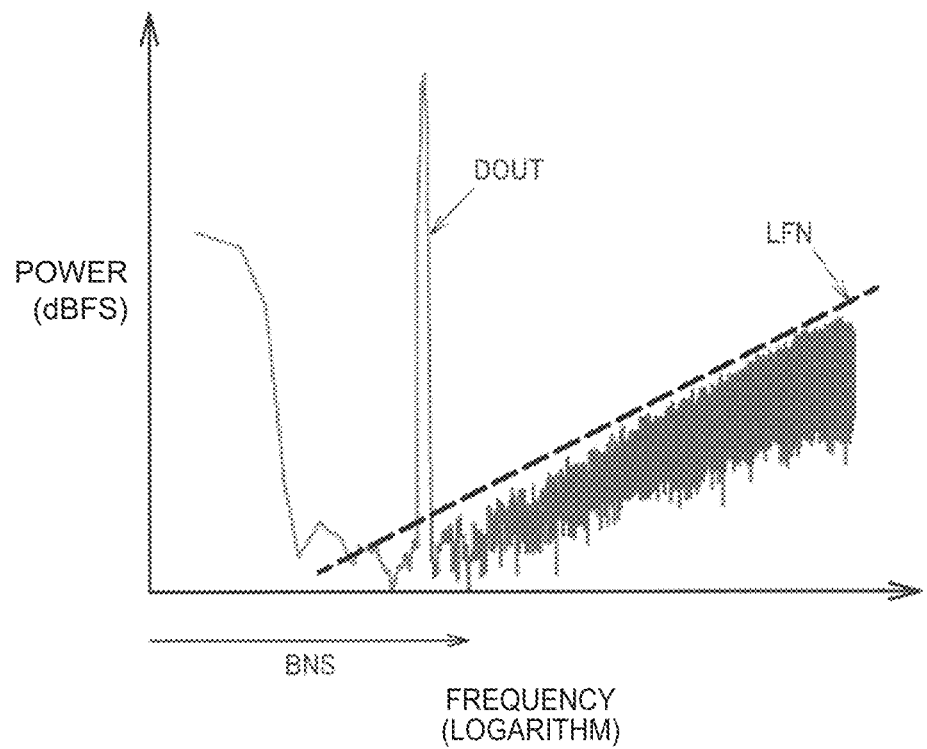
FIG. 3 is an example of frequency characteristics of A/D conversion result data in the present embodiment.

FIG. 3 shows an example of the frequency characteristics of the A/D conversion result data DOUT in the present embodiment. In the example of FIG. 3, a signal of a predetermined frequency is input as an input signal, which is shown as a peak of the frequency characteristics. The input signal is not limited to the signal of the predetermined frequency, but a signal including the frequency component of a signal band BNS may be assumed. When the signal band BNS is lower than the conversion rate of the A/D conversion, the signal band BNS is over-sampled at a high conversion rate. For example, the conversion rate is 5 times or more, or 10 times or more the upper limit frequency of the signal band BNS. Since the floor noise (quantization noise) in a low frequency band is reduced by the noise shaping effect as indicated by the straight line FLN, it is possible to improve S/N by lowering the noise of higher frequency than the signal band BNS with a low-pass filter. As a result, it is possible to achieve high accuracy (for example, enlarging the number of effective bits) of the A/D conversion result data.

2. First Detailed Configuration Example

Figure 4:
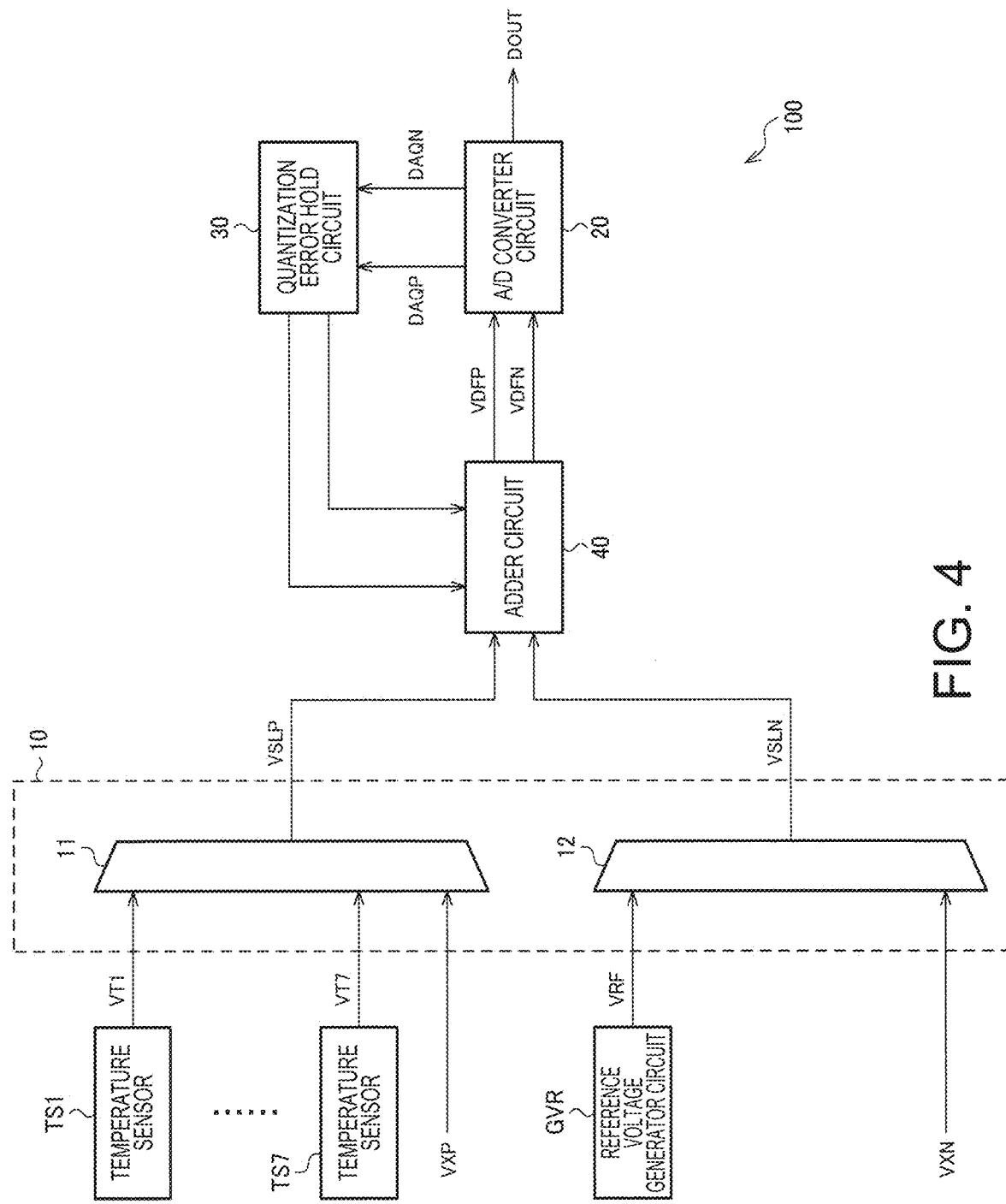
FIG. 4 is a first detailed configuration example of the circuit device.

FIG. 4 shows a first detailed configuration example of the circuit device 100. The circuit device 100 of FIG. 4 includes the selector 10, the A/D converter circuit 20, the quantization error hold circuit 30, and the adder circuit 40. In addition, the circuit device 100 may include a reference voltage generator circuit GVR. The case where n=8 will be described below, but is not limited to n=8.

The temperature sensors TS1 to TS7 are sensors for measuring the temperature of a temperature measurement target. As the temperature sensors TS1 to TS7, for example, a temperature sensor utilizing the temperature dependency of the bandgap voltage of the PN junction or a thermistor utilizing the temperature dependency of the resistance value of the resistance or the like may be used. Apart of the temperature sensors TS1 to TS7 is built in the circuit device 100, and the rest are provided outside the circuit device 100 (for example, inside the oscillation device and the like including the circuit device 100). Alternatively, all of the temperature sensors TS1 to TS7 may be built in the circuit device 100, or all of the temperature sensors TS1 to TS7 may be provided outside the circuit device 100.

The selector 10 includes a selector 11 (selector on positive electrode side and a first selector) and a selector 12 (selector on negative electrode side and a second selector).

Temperature detection voltages VT1 to VT7 (first to seventh voltages on positive electrode side) from temperature sensors TS1 to TS7 are input to the selector 11. In addition, an arbitrary voltage VXP (an eighth voltage on positive electrode side) used for a test or the like, may be input to the selector 11, for example. A reference voltage VRF (a first voltage on negative electrode side) from the reference voltage generator circuit GVR is input to the selector 12. In addition, an arbitrary voltage VXN (a second voltage on negative electrode side) used for a test or the like, may be input to the selector 12, for example. For example, the reference voltage generator circuit GVR is a band gap reference circuit, and the reference voltage VRF is a band gap reference voltage (a voltage with no temperature dependency).

The selector 11 sequentially selects the temperature detection voltages VT1 to VT7 and the arbitrary voltage VXP to output the voltage as the time-division output voltage VSLP. When the selector 12 is outputting the temperature detection voltages VT1 to VT7, the selector 12 selects the reference voltage VRF to output the voltage as the output voltage VSLN. In addition, when selecting the arbitrary voltage VXP, the selector 11 selects the arbitrary voltage VXN to output the voltage as the output voltage VSLN.

In this configuration example, the differential voltage signal constructed of (VT1 and VRF) corresponds to the voltage VI1 in FIG. 1. Similarly, the differential voltage signals constructed of (VT2 and VRF), (VT3 and VRF), (VT4 and VRF), (VT5 and VRF), (VT6 and VRF), (VT7 and VRF), and (VXP and VXN) correspond to the voltages VI2, VI3, VI4, VI5, VI6, VI7, and VI8 in FIG. 1.

The adder circuit 40 differentially amplifies the differential voltage signals (VSLP and VSLN) from the selector 10 and performs charge voltage conversion (differential QV conversion) on the charge on the positive electrode side and the charge on the negative electrode side from the quantization error hold circuit 30 to output differential voltage signals (VDFP and VDFN) obtained by adding the differential voltage signals.

The A/D converter circuit 20 is a differential input A/D converter circuit 20. That is, the A/D converter circuit 20 performs A/D conversion on the differential voltage signals constructed of the output voltages VDFP and VDFN of the adder circuit 40 to output the A/D conversion result data DOUT corresponding to the difference between the output voltages VDFP and VDFN.

The quantization error hold circuit 30 holds differential voltage signals (DAQP and DAQN) which are output signals of the D/A converter circuit 21 after the successive approximation operation of the A/D converter circuit 20 is completed. Specifically, the quantization error hold circuit holds the charge corresponding to the voltage DAQP constructing the differential voltage signal and the charge corresponding to the voltage DAQN.

According to the present embodiment, the temperature detection voltages VT1 to VT7 from the temperature sensors TS1 to TS7 are input to the selector 10 as the voltages VI1 to VI7 of the voltages VI1 to VI8. The number of temperature sensors is not limited to 7. That is, first to m-th temperature detection voltages from first to m-th temperature sensors (m is an integer from 1 to n) may be input to the selector 10 as first to m-th voltages of the first to n-th voltages.

Since the change in temperature is gentle, the signal band of the temperature detection voltages VT1 to VT7 output from the temperature sensors TS1 to TS7 is in a low frequency band (for example, 100 Hz or less). Therefore, even with a comparatively low speed A/D converter circuit such as the successive approximation type, it is possible to perform A/D conversion with a sufficiently higher conversion rate than the signal band. In the present embodiment, it is possible to realize an oversampling state accompanied by the noise shaping effect as described above and to measure high S/N in the signal band of the temperature sensor by constructing a hybrid type A/D converter circuit.

Temperature compensation processing in a digital oscillator such as a temperature compensated crystal oscillator (TCXO) or an oven controlled crystal oscillator (OCXO) may be considered as processing using temperature detection data (A/D conversion result data of temperature detection voltage). TCXO and OCXO are used as reference signal sources and the like in mobile communication terminals, GPS related equipment, wearable equipment, in-vehicle equipment, and the like, for example. In such an oscillator such as TCXO, high frequency stability is desired, but in order to realize high frequency stability, highly accurate temperature detection is required. There is a possibility that the temperature of the vibrator (for example, a quartz vibrator or the like) is estimated with high accuracy by using a plurality of temperature sensors provided at a plurality of positions inside (or internal and external) the oscillator. Since the temperature of the vibrator may be estimated with high accuracy, it is possible to improve the accuracy of temperature compensation and the stability of the oscillation frequency. In a case where the hybrid type A/D converter circuit of the related art is adopted for processing using temperature detection data in a TCXO and an OCXO, while it was not possible to cope with multi-channel input from a plurality of temperature sensors, in the present embodiment, since it is possible to construct a hybrid A/D converter circuit coping with multichannel input, it is possible to perform A/D conversion with high accuracy for the multi-channel input from the plurality of temperature sensors.

3. Second Detailed Configuration Example

Figure 5:
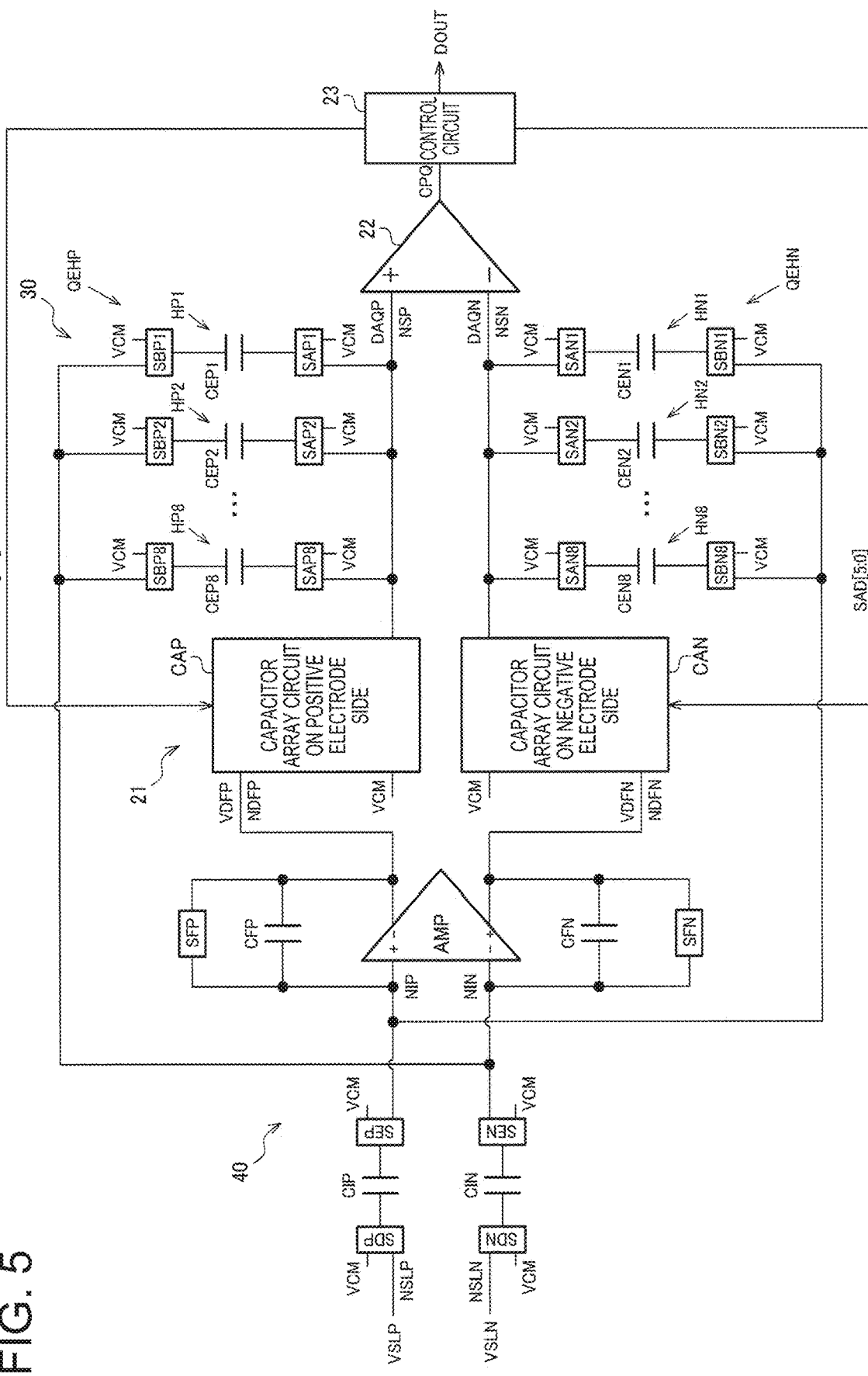
FIG. 5 is a second detailed configuration example of the circuit device.
Figure 6:
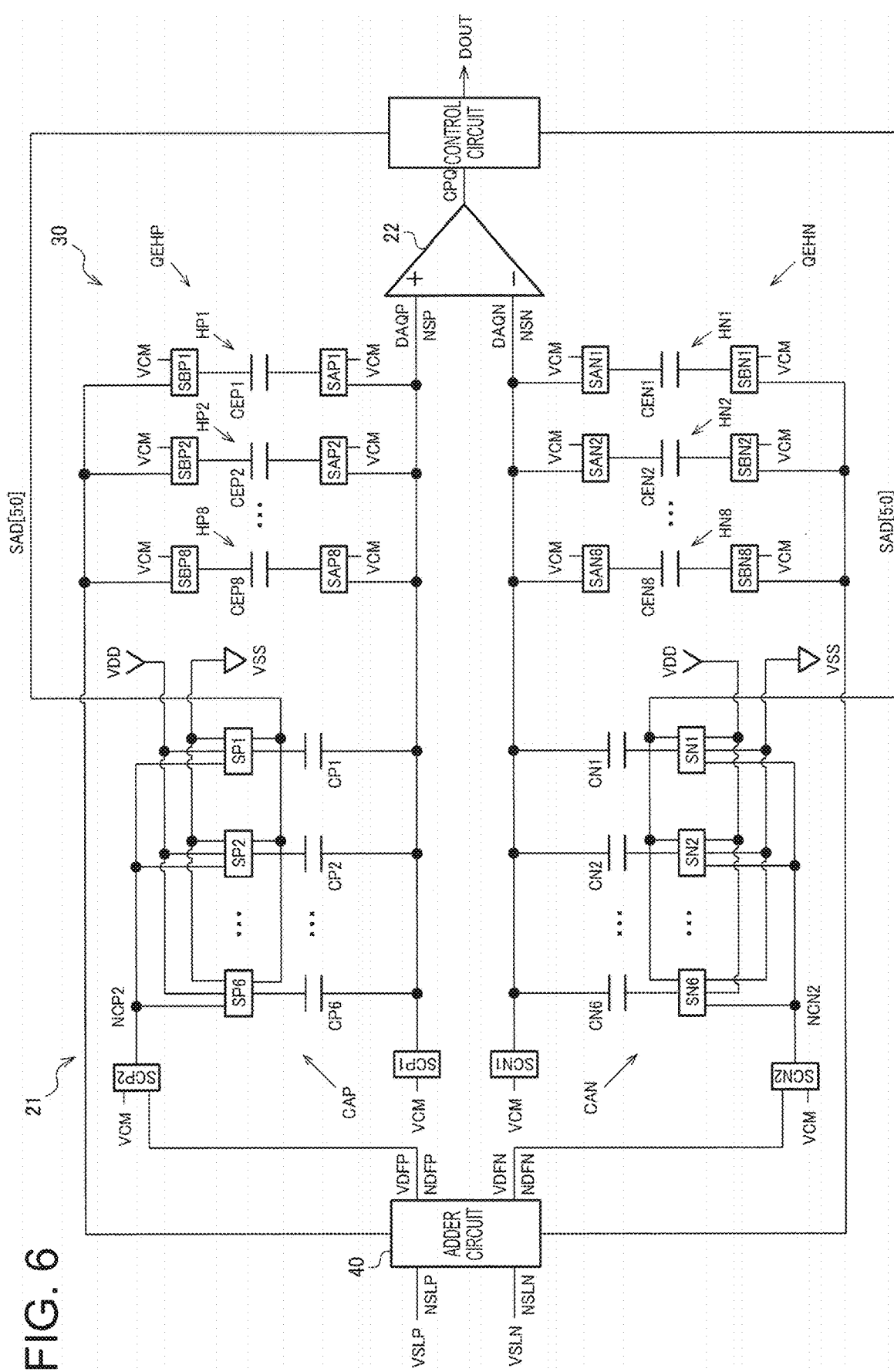
FIG. 6 is a second detailed configuration example of the circuit device.

FIGS. 5 and 6 show a second detailed configuration example of the circuit device 100. A second detailed configuration example is shown separately in FIGS. 5 and 6, and the same constituent elements are denoted by the same reference numerals. The case where n=8 will be described below, but is not limited to n=8.

As shown in FIG. 5, the adder circuit 40 includes the capacitor CIP (input capacitor on positive electrode side), the capacitor CIN (input capacitor on negative electrode side, the capacitor CFP (feedback capacitor on positive electrode side), the capacitor CFN (feedback capacitor on negative electrode side), the switches SDP, SDN, SEP, SEN, SFP, and SFN, and a fully differential operational amplifier AMP. The fully differential operational amplifier is an operational amplifier of a differential input and a differential output.

The switch SDP connects one end of the capacitor CIP to one of the output node NSLP (a first output node of the selector 10) and the node of the common voltage VCM of the selector 11. The switch SDN connects one end of the capacitor CIN to one of the output node NSLN (a second output node of the selector 10) and the node of the common voltage VCM of the selector 12. The switch SEP connects the other end of the capacitor CIP to one of the non-inverting input node NIP of the operational amplifier AMP and the node of the common voltage VCM. The switch SEN connects the other end of the capacitor CIN to one of the inverting input node NIN of the operational amplifier AMP and the node of the common voltage VCM. One end of the capacitor CFP and one end of the switch SFP are connected to the non-inverting input node NIP of the operational amplifier AMP, and the other end of the capacitor CFP and the other end of the switch SFP are connected to an inverting output node NDFP of the operational amplifier AMP. One end of the capacitor CFN and one end of the switch SFN are connected to the inverting input node NIN of the operational amplifier AMP, and the other end of the capacitor CFN and the other end of the switch SFN are connected to the non-inverting output node NDFN of the operational amplifier AMP. The switches SDP, SDN, SEP, SEN, SFP, and SFN are, for example, analog switches constructed of transistors.

As shown in FIGS. 5 and 6, the D/A converter circuit 21 is a differential D/A converter circuit. The D/A converter circuit 21 includes a capacitor array circuit CAP (capacitor array circuit on positive electrode side) and a capacitor array circuit CAN (capacitor array circuit on negative electrode side).

As shown in FIG. 6, the capacitor array circuit CAP includes capacitors CP1 to CP6 and switches SP1 to SP6, SCP1, and SCP2. One end of the switch SCP1 is connected to the sampling node NSP of the capacitor array circuit CAP and the other end is connected to the node of the common voltage VCM. One end of the capacitor CPj (j is an integer from 1 to 6) is connected to the sampling node NSP. The switch SPj connects the other end of the capacitor CPj to any one of a node NCP2, the node of a voltage VDD (power supply voltage, a first voltage), and the node of a voltage VSS (ground voltage, a second voltage). The switch SCP2 connects the node NCP2 to one of the inverting output node NDFP of the operational amplifier AMP and the node of the common voltage VCM. The capacitance value of the capacitor CPj is $CP1 \times 2^{j-1}$. The switches SP1 to SP6, SCP1 and SCP2 are, for example, analog switches consisting of transistors.

The capacitor array circuit CAN includes capacitors CN1 to CN6 and switches SN1 to SN6, SCN1, and SCN2. One end of the switch SCN1 is connected to the sampling node NSN of the capacitor array circuit CAN and the other end is connected to the node of the common voltage VCM. One end of a capacitor CNj is connected to the sampling node NSN. A switch SNj connects the other end of the capacitor CNj to any one of a node NCN2, the node of the voltage VDD, and the node of the voltage VSS. The switch SCN2 connects the node NCN2 to one of the node of the non-inverting output node NDFN of the operational amplifier AMP and the node of the common voltage VCM. The capacitance value of the capacitor CNj is $CN1 \times 2^{j-1}$. The switches SN1 to SN6, SCN1 and SCN2 are, for example, analog switches consisting of transistors.

The number of capacitors included in the capacitor array circuits CAP and CAN is not limited to 6, the capacitor array circuit CAP may include first to k-th capacitors on the positive electrode side (k is an integer of 2 or more), and the capacitor array circuit CAN may include first to k-th capacitors on the negative electrode side. In this case, j is an integer of 1 or more and k or less. In addition, successive approximation data is k-bit data SAD[k−1:0].

As shown in FIGS. 5 and 6, the quantization error hold circuit 30 includes the quantization error hold circuit QEHP (quantization error hold circuit on positive electrode side) and the quantization error hold circuit QEHN (quantization error hold circuit on negative electrode side).

As shown in FIG. 5, the quantization error hold circuit QEHP includes hold circuits HP1 to HP8 (first to n-th positive electrode side hold circuits). The hold circuit HPi (the i-th hold circuit on positive electrode side) includes a capacitor CEPi (hold capacitor on positive electrode side), a switch SAPi (a first switch on positive electrode side), and a switch SBPi (a second switch on positive electrode side). The switch SAPi connects one end of the capacitor CEPi to one of the sampling node NSP and the node of the common voltage VCM or sets the one end of the capacitor CEPi to a floating state. The switch SBPi connects the other end of the capacitor CEPi to one of the inverting input node NIN of the operational amplifier AMP and the node of the common voltage VCM. The capacitance values of the capacitors CEP1 to DEP8 are the same. The switches SAP1 to SAP8 and SBP1 to SBP8 are, for example, analog switches consisting of transistors.

The quantization error hold circuit QEHN includes hold circuits HN1 to HN8 (first to n-th hold circuits on negative electrode side). The hold circuit HNi (the i-th hold circuit on negative electrode side) includes a capacitor CENi (hold capacitor on negative electrode side), a switch SANi (a first switch on the negative electrode side), a switch SBNi (a second switch on the negative electrode side). The switch SANi connects one end of the capacitor CENi to one of the sampling node NSN and the node of the common voltage VCM or sets the one end of the capacitor CENi to a floating state. The switch SBNi connects the other end of the capacitor CENi to one of the non-inverting input node NIP of the operational amplifier AMP and the node of the common voltage VCM. The capacitance values of the capacitors CENT to CEN8 are the same. The switches SAN1 to SAN8 and SBN1 to SBN8 are, for example, analog switches consisting of transistors.

The hold circuits HPi and HNi in FIGS. 5 and 6 correspond to quantization error hold circuit QEHi in FIG. 1.

The comparator circuit 22 is a comparator of a differential input single-ended output. The non-inverting input node of the comparator circuit 22 is connected to the sampling node NSP, and the inverting input node is connected to the sampling node NSN. The voltages DAQP and DAQN which are D/A converted voltages are output to the voltages of the sampling nodes NSP and NSN. When DAQP-DAQN>0 V, the comparator circuit 22 outputs a high-level signal CPQ, and when DAQP-DAQN<0 V, the comparator circuit 22 outputs a low-level signal CPQ. The control circuit 23 updates the successive approximation data SAD [5:0] based on the signal CPQ and outputs the successive approximation data SAD [5:0] to the switches SP1 to SP6 and SN1 to SN6. In addition, the control circuit 23 controls the switches included in the adder circuit 40, the D/A converter circuit 21, and the quantization error hold circuit 30.

The operation of the circuit device 100 in FIGS. 5 and 6 will be described below. Hereinafter, the operation in the k-th A/D conversion when the selector 10 selects the voltage VIi will be described. The state of the switch not mentioned in each period is the same as the state in the previous period.

In the reset period (initialization period), the switches SFP and SFN of the adder circuit 40 are on. As a result, both ends of the capacitors CFP and CFN are connected, and the charges of the capacitors CFP and CFN are reset (initialized). In addition, the switches SCP1 and SCN1 of the capacitor array circuits CAP and CAN are turned on, the switches SCP2 and SCN2 select the node of the common voltage VCM, and the switches SP1 to SP6 and SN1 to SN6 select the nodes NCP2 and NCN2. As a result, both ends of the capacitors CP1 to CP6 and CN1 to CN6 become the common voltage VCM, and the charges of the capacitors CP1 to CP6 and CN1 to CN6 are reset. In addition, the switches SAP1 to SAP8 and SAN1 to SAN8 of the quantization error hold circuits QEHP and QEHN select the floating state, and the switches SBP1 to SBP8 and SBN1 to SBN8 select the node of the common voltage VCM. As a result, the capacitors CEPi and CENi hold charges corresponding to the quantization error in the (k−1)th A/D conversion on the voltage VIi. That is, assuming that DAQP=EPi and DAQN=ENi after the successive approximation operation of the (k−1)th A/D conversion is completed, the capacitors CEPi and CENi hold the voltages EPi and ENi corresponding to the quantization error with reference to the common voltage VCM. However, the voltages at which the voltages EPi and ENi are attenuated are held as described in the following equation (2).

In a first addition operation period after the reset period, the switches SFP and SFN of the adder circuit 40 are off, the switches SBPi and SBNi of the quantization error hold circuits QEHP and QEHN select the input nodes NIN and NIP of the operational amplifier AMP, and the switches SAPi and SANi select the node of the common voltage VCM. As a result, the charge held by the capacitor CEPi is redistributed by the capacitors CEPi and CFN, and the charge held by the capacitor CENi is redistributed by the capacitors CENi and CFP. That is, the differential voltage signal constructed of (the attenuated voltages of) the voltages EPi and ENi corresponding to the quantization error in the (k−1)th A/D conversion is differentially amplified with a negative gain. In addition, in the first addition operation period, the switches SDP and SDN of the adder circuit 40 select the output nodes NSLP and NSLN of the selector 10, and the switches SEP and SEN select the node of the common voltage VCM. As a result, the capacitors CIP and CIN sample the input voltages (VSLP and VSLN) with reference to the common voltage VCM.

In a second addition operation period after the first addition operation period, the switches SDP and SDN select the node of the common voltage VCM, and switches SEP and SEN select the input nodes NIP and NIN of the operational amplifier AMP. As a result, a differential voltage signal constructed of the input voltages (VSLP and VSLN) is differentially amplified with a positive gain. With the above operation, a differential voltage signal constructed of the input voltages (VSLP and VSLN) which is differentially amplified with a positive gain, and a differential voltage signal constructed of (the attenuated voltages of) the voltages EPi and ENi which is differentially amplified with a negative gain are added. The addition result is output as a differential voltage signal consisting of the output voltages VDFP and VDFN. When the second addition operation period ends, the switches SDP and SDN of the adder circuit 40 select the output nodes NSLP and NSLN of the selector 10, and the switches SEP and SEN select the node of the common voltage VCM. That is, the capacitors CIP and CIN again sample the input voltages (VSLP and VSLN) with reference to the common voltage VCM.

In the sampling period after the second addition operation period, the switches SCP1 and SCN1 of the capacitor array circuits CAP and CAN are on, and the switches SCP2 and SCN2 select the output nodes NDFP and NDFN of the adder circuit 40. As a result, the capacitors CP1 to CP6 and CN1 to CN6 sample the output voltages VDFP and VDFN of the adder circuit 40 with reference to the common voltage VCM.

In the successive approximation operation period after the sampling period, the switches SCP1 and SCN1 of the capacitor array circuits CAP and CAN are off, and the switches SP1 to SP6 and SN1 to SN6 select the voltage VDD or the voltage VSS based on successive approximation data SAD [5:0]. Specifically, when SAD [j]=1, the switch SPj selects the voltage VDD, and the switch SNj selects the voltage VSS. When SAD [j]=0, the switch SPj selects the voltage VSS, and the switch SNj selects the voltage VDD. As a result, the voltages DAQP and DAQN at which DAQP-DAQN=V(SAD [5:0])-(VDFP-VDFN) are output to the sampling nodes NSP and NSN. The comparator circuit 22 determines whether the DAQP-DAQN is positive or negative and outputs the result as the signal CPQ. The control circuit 23 updates the successive approximation data SAD [5:0] based on the signal CPQ. The above operation is repeated successively until the A/D conversion result data is determined.

In the quantization error holding period next to the successive approximation operation period, the control circuit 23 outputs the A/D conversion result data as successive approximation data SAD [5:0]. As a result, the voltages EPi and ENi corresponding to the quantization error in the k-th A/D conversion on the voltage VIi are output to the sampling nodes NSP and NSN. The switches SAPi and SANi of the quantization error hold circuits QEHP and QEHN select the sampling nodes NSP and NSN, and the switches SBPi and SBNi select the node of the common voltage VCM. As a result, the capacitors CEPi and CENi hold charges corresponding to the quantization error in the k-th A/D conversion on the voltage VIi. That is, the capacitors CEPi and CENi hold the voltages EPi and ENi with reference to the common voltage VCM. However, the voltages at which the voltages EPi and ENi are attenuated are held as described in the following equation (2).

After the quantization error holding period, the k-th A/D conversion is performed on a voltage VIi+1. After the k-th A/D conversion on the voltage VIn is completed, (k+1) th A/D conversion is performed on the voltage VI1.

In the above operation, the output voltage of the adder circuit 40 is expressed by the following equation (2). k represents the voltage at the k-th A/D conversion operation. VDF (k) is VDFP-VDFN after the second addition operation period. CI is the capacitance value of the capacitor CIP, and the capacitance value of the capacitor CIN is also CI. CF is the capacitance value of the capacitor CFP, and the capacitance value of the capacitor CFN is also CF. VSL (k) is VSLP-VSLN after the first addition operation period. CE is the capacitance value of the capacitor CEPi, and the capacitance value of the capacitor CENi is also CE. Ctotal is the sum of the capacitance values of the capacitors CP1 to CP6. E(k−1) is EPi-ENi in the (k−1)th A/D conversion.

$$VDF(k) = \frac{CI}{CF} \times VSL(k) - \frac{CE}{CF} \times \frac{Ctotal}{Ctotal + CE} \times E(k-1) \qquad (2)$$

In the above equation (2), the capacitance values CE, CF, and Ctotal are set so that the gain of E(k−1) becomes −1. E(k−1) is attenuated with the gain Ctotal/(Ctotal+CE) due to the charge redistribution between the capacitors CP1 to CP6 (Ctotal) and the capacitor CEPi (CE) and the charge redistribution between the capacitors CN1 to CN6 (Ctotal) and the capacitor CENi (CE). When the adder circuit 40 performs addition operation, a gain CE/CF is multiplied, and therefore the attenuated E(k−1) may be amplified. As a result, it is possible to set the gain of E(k−1) to −1, and it is possible to realize a transfer function having noise shaping characteristics like the above equation (1).

According to the present embodiment described above, the switch SAPi connects one end of the capacitor CEPi to the sampling node NSP and the switch SBPi connects the other end of the capacitor CEPi to the node of the common voltage VCM, whereby the capacitor CEPi may hold the charge corresponding to the quantization error. Similarly, the switch SANi connects one end of the capacitor CENi to the sampling node NSN and the switch SBNi connects the other end of the capacitor CENi to the node of the common voltage VCM, whereby the capacitor CENi may hold the charge corresponding to the quantization error. Then, the switch SAPi connects one end of the capacitor CEPi to the node of the common voltage VCM and the switch SBPi connects the other end of the capacitor CEPi to the inverting input node NIN of the operational amplifier AMP, whereby the charge held by the capacitor CEPi is redistributed among the capacitors CEPi and CFN. The switch SANi connects one end of the capacitor CENi to the node of the common voltage VCM and the switch SBNi connects the other end of the capacitor CENi to the inverting input node NIP of the operational amplifier AMP, whereby the charge held by the capacitor CENi is redistributed among the capacitors CENi and CFP. As a result, the voltage corresponding to the quantization error may be subtracted from the input voltages (VSLP and VSLN) of the A/D converter circuit 20.

4. Chopping Modulation

Figure 7:
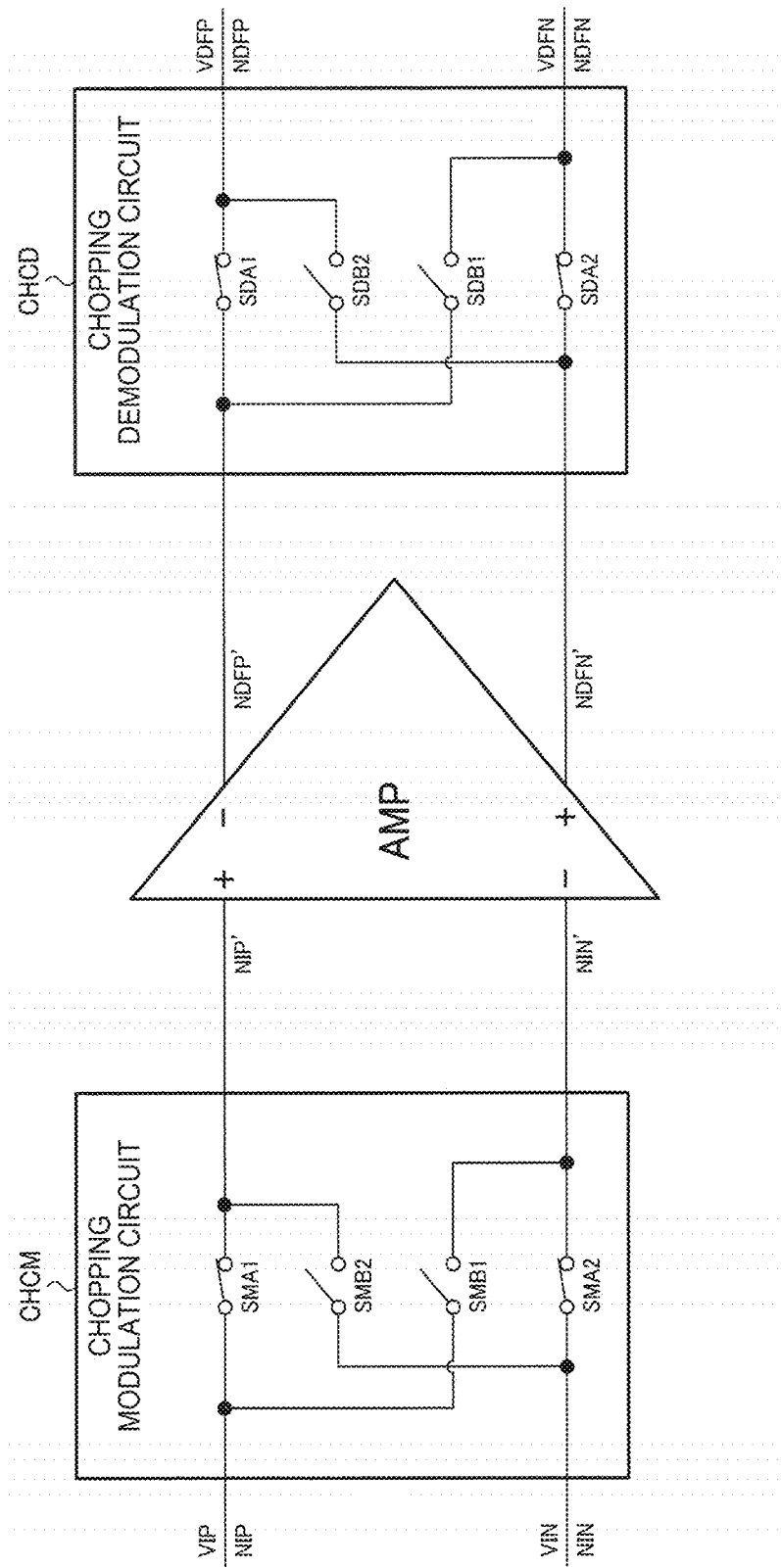
FIG. 7 is a configuration example of a chopping modulation circuit and a chopping demodulation circuit in the case of performing chopping modulation in an adder circuit.

FIG. 7 shows a configuration example of a chopping modulation circuit and a chopping demodulation circuit in a case where chopping modulation is performed in the adder circuit 40. In FIG. 7, the adder circuit 40 includes a chopping modulation circuit CHCM and a chopping demodulation circuit CHCD. In the case of applying the configuration of FIG. 7 to FIG. 5, the nodes NIP, NIN, NDFP, and NDFN of FIG. 7 correspond to the nodes NIP, NIN, NDFP, and NDFN of FIG. 5.

The chopping modulation circuit CHCM performs chopping modulation on the voltage input to a non-inverting input node NIP' and an inverting input node NIN' of the operational amplifier AMP. That is, the chopping modulation circuit CHCM performs chopping modulation on the voltages VIP and VIN of the nodes NIP and NIN and outputs the modulated voltages to the nodes NIP' and NIN'.

The chopping modulation circuit CHCM includes switches SMA1, SMA2, SMB1, and SMB2. One ends of the switches SMA1 and SMB1 are connected to the node NIP, and one ends of the switches SMA2 and SMB2 are connected to the node NIN. The other ends of the switches SMA1 and SMB2 are connected to the node NIP', and the other ends of the switches SMA2 and SMB1 are connected to the node NIN'. The switches SMA1, SMA2, SMB1, and SMB2 are, for example, analog switches consisting of transistors. In the non-inverting operation, the switches SMA1 and SMA2 are on, the switches SMB1 and SMB2 are off, and voltages VIP and VIN are input to the nodes NIP' and NIN'. In the inverting operation, the switches SMA1 and SMA2 are off, the switches SMB1 and SMB2 are on, and the voltages VIN and VIP are input to the nodes NIP' and NIN'.

The chopping demodulation circuit CHCD performs chopping demodulation on the voltages output from the inverting output node NDFP' and the non-inverting output node NDFN' of the operational amplifier AMP. That is, the chopping demodulation circuit CHCD performs chopping demodulation on the voltages of the nodes NDFP' and NDFN' to output the demodulated voltages VDFP and VDFN to the nodes NDFP and NDFN. The chopping demodulation circuit CHCD includes switches SDA1, SDA2, SDB1, and SDB2. One ends of the switches SDA1 and SDB1 are connected to the node NDFP', and one ends of the switches SDA2 and SDB2 are connected to the node NDFN'. The other ends of the switches SDA1 and SDB2 are connected to the node NFDF, and the other ends of the switches SDA2 and SDB1 are connected to the node NDFN. In the non-inverting operation, the switches SDA1 and SDA2 are on, the switches SDB1 and SDB2 are off, and the voltages of the nodes NDFP' and NDFN' are output to the nodes NDFP and NDFN as the voltages VDFP and VDFN. The switches SDA1, SDA2, SDB1, and SDB2 are, for example, analog switches consisting of transistors. In the inverting operation, the switches SDA1 and SDA2 are off, the switches SDB1 and SDB2 are on, and the voltages of the nodes NDFN' and NDFP' are output to the nodes NDFP and NDFN as the voltages VDFP and VDFN.

The operational amplifier AMP has an offset. For example, an offset is generated between the nodes NIP' and NIN' by making the sizes of the two transistors constructing a differential pair of the operational amplifier AMP different.

The chopping modulation circuit CHCM and the chopping demodulation circuit CHCD alternately repeat the inverting operation and the non-inverting operation. Specifically, one of the inversion operation and the non-inversion operation is performed in the (k−1)th A/D conversion, and the other of the inversion operation and the non-inversion operation is performed in the k-th A/D conversion. As a result, the offset of the operational amplifier AMP is modulated at a chopping frequency. Specifically, the polarity of the offset is inverted between the (k−1)th A/D conversion and the k-th A/D conversion.

Figure 8:
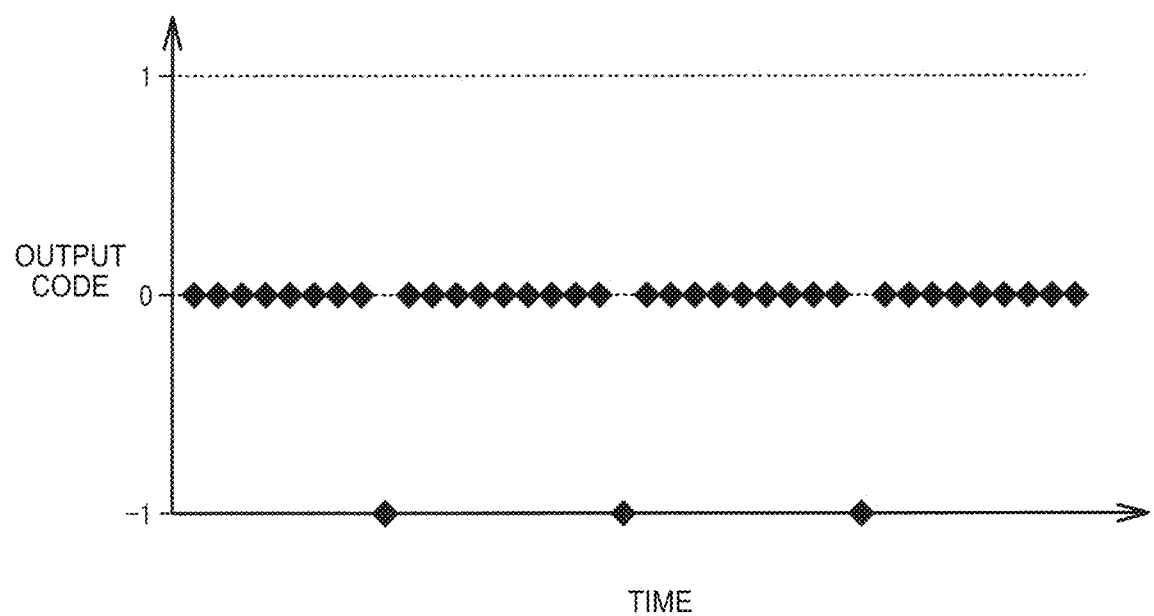
FIG. 8 is an example of a temporal change in the A/D conversion result data (output code) when 0 V is input in a case where chopping modulation is not performed.

FIG. 8 shows an example of a temporal change in the A/D conversion result data (output code) when 0 V is input in a case where chopping modulation is not performed. Since the present embodiment has a primary noise shaping mechanism, when a DC signal is input to the A/D converter circuit 20, the A/D converter result data DOUT has a specific time change pattern, and unnecessary frequency components may be generated in the A/D conversion result data DOUT. This phenomenon is referred to as the idle tone. For example, it is assumed that the A/D conversion result data of the temperature detection voltage is used for the temperature compensation processing of the TCXO. At this time, if the A/D conversion result data changes at a constant cycle, the oscillation frequency is corrected at that cycle, which may deteriorate the oscillation characteristics.

Figure 9:
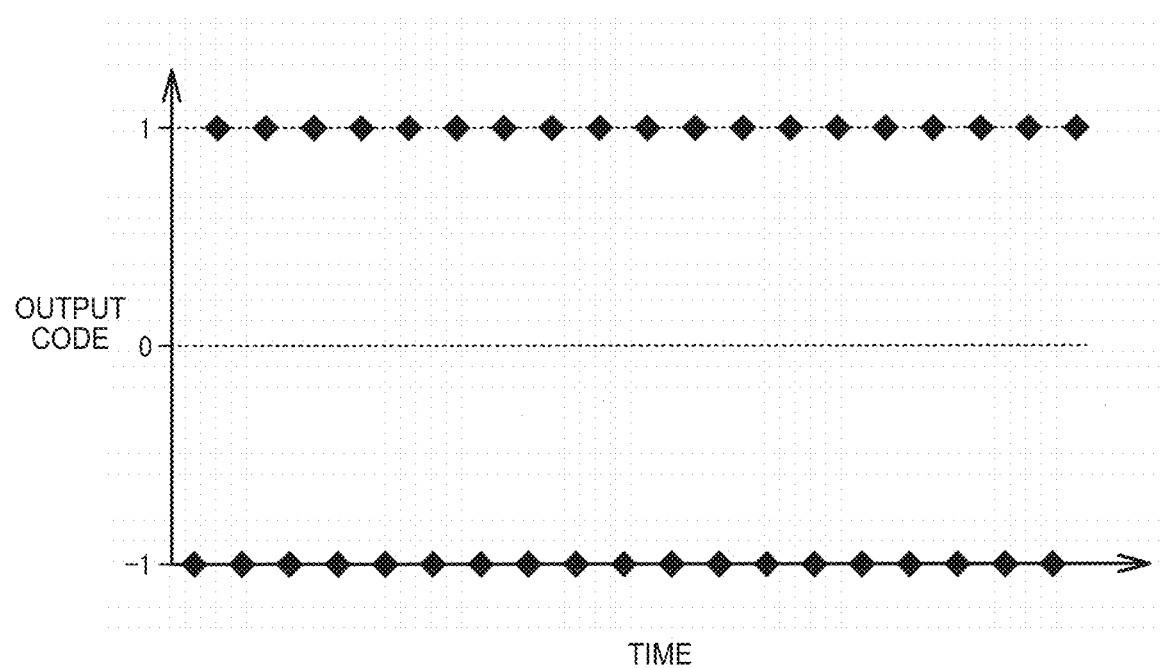
FIG. 9 is an example of a temporal change in the A/D conversion result data (output code) when 0 V is input in the present embodiment.

FIG. 9 shows an example of a temporal change in the A/D conversion result data (output code) when 0 V is input in the present embodiment. In the present embodiment, since chopping modulation is performed, the polarity of the offset is inverted every A/D conversion. Therefore, the change in the A/D conversion result data due to the offset becomes a high frequency by the frequency of the chopping, and the idle tone as described above may be reduced. For example, in the temperature compensation processing of the TCXO, it is possible to reduce the possibility that the oscillation characteristics are degraded by the idle tone.

5. Vibration Device

Figure 10:
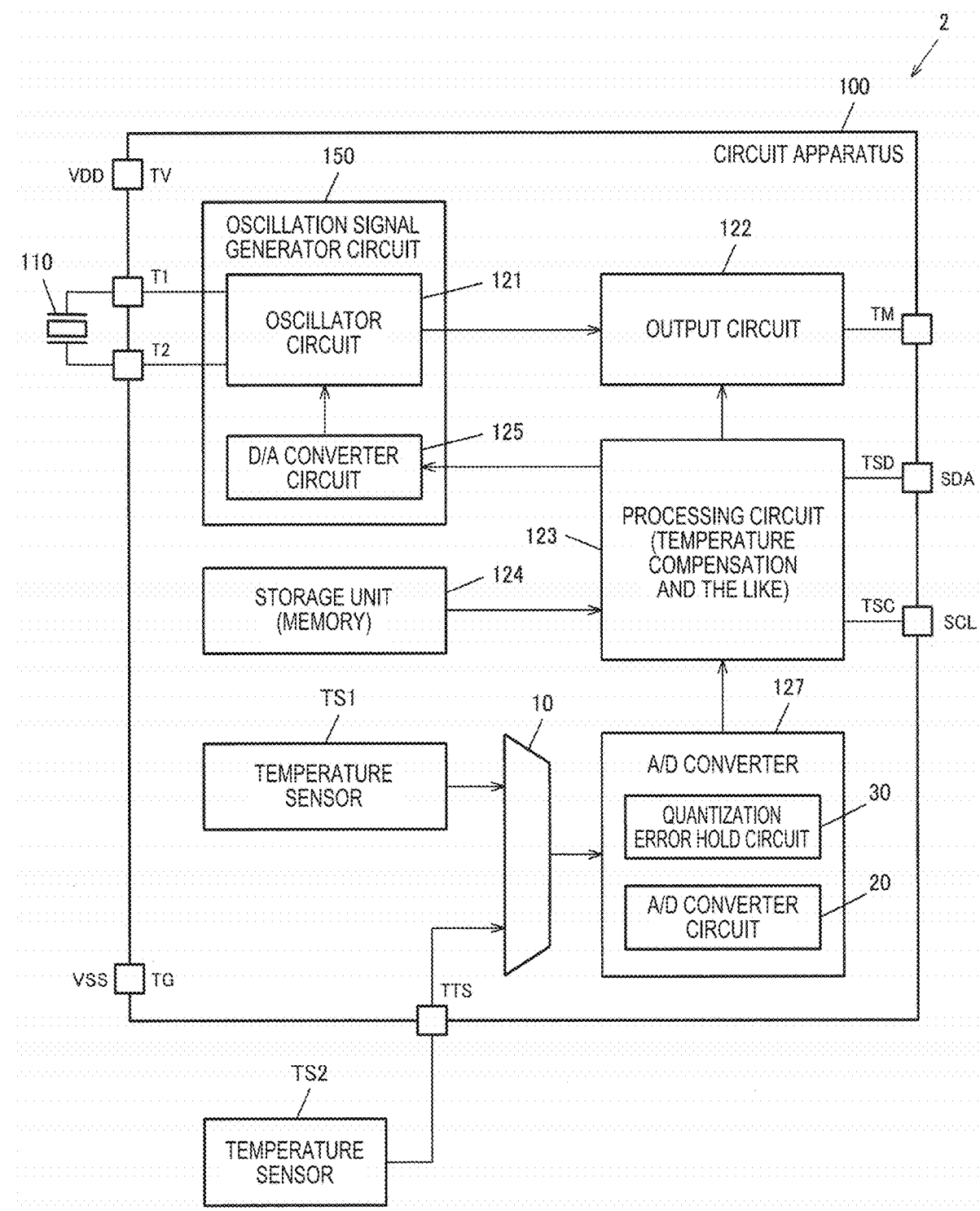
FIG. 10 is a first configuration example of the vibration device including the circuit device.

A configuration example of a vibration device 2 including the circuit device 100 will be described below. FIG. 10 shows a first configuration example of the vibration device 2 including the circuit device 100. In FIG. 10, the case where the vibration device 2 is an oscillator will be described as an example. Specifically, an example of application to TCXO which is a temperature-compensated oscillator will be described. The temperature-compensated oscillator may be an OCXO.

The vibration device 2 (oscillator) includes a vibrator 110 and a circuit device 100. In addition, the vibration device 2 may include a temperature sensor TS2. For example, the vibrator 110, the circuit device 100, and the temperature sensor TS2 are housed in a package, whereby the vibration device 2 is configured.

One end of the vibrator 110 is connected to a terminal T1, and the other end is connected to a terminal T2. The vibrator 110 (resonator) is an element (vibrating element) that generates mechanical vibration by an electric signal. The vibrator 110 may be realized by a vibration piece (piezoelectric vibration piece) such as a crystal vibration piece and the like. For example, the vibrator 110 may be realized by a quartz crystal vibration piece whose cut angle vibrates in thickness shear such as AT cut or SC cut. For example, the vibrator 110 is a vibrator built in a temperature-compensated oscillator (TCXO) without a thermostat. Alternatively, the vibrator 110 may be a vibrator or the like built in an oven controlled crystal oscillator (OCXO) including a thermostat. The vibrator 110 of the present embodiment may be realized by various vibration pieces such as a vibration piece other than a thickness shear vibration type, a piezoelectric vibration piece formed of a material other than quartz. For example, a surface acoustic wave (SAW) resonator, a micro electro mechanical systems (MEMS) vibrator as a silicon vibrator formed by using a silicon substrate, or the like may be adopted as the vibrator 110.

The circuit device 100 includes a processing circuit 123, an oscillation signal generator circuit 150, the selector 10, and an A/D converter 127. In addition, the circuit device 100 includes a storage unit 124 (memory), a temperature sensor TS1 and an output circuit 122, terminals T1 and T2, an output terminal TM, a sensor input terminal TTS, signal terminals TSD and TSC, and power supply terminals TV and TG for power supply. The circuit device 100 is an integrated circuit device (IC, semiconductor chip). The terminals T1 and T2, the output terminal TM, the sensor input terminal TTS, the signal terminals TSD and TSC, and the power supply terminals TV and TG are called pads of an integrated circuit device, for example.

The oscillation signal generator circuit 150 generates an oscillation signal having an oscillation frequency corresponding to the frequency control data by using the vibrator 110. The oscillation signal generator circuit 150 includes an oscillation circuit 121 for oscillating the vibrator 110. In addition, the oscillation signal generator circuit 150 may further include a D/A converter circuit 125 to be described later.

The oscillator circuit 121 includes a drive circuit and is a circuit that oscillates the vibrator 110 by driving the vibrator 110 with the drive circuit via the terminals T1 and T2. As the oscillator circuit 121, for example, a pierce type oscillator circuit may be adopted. In this case, the drive circuit includes a bipolar transistor and a resistor connected between the base and the collector of the bipolar transistor. The base of the bipolar transistor becomes an input node of the drive circuit and the collector becomes an output node of the drive circuit. A variable capacitance circuit is provided for at least one connection node of the output node and the input node of the drive circuit. The variable capacitance circuit may be realized by a capacitor array or the like in which the number of capacitors connected to the connection node is switched based on a varactor whose capacitance value varies based on the control voltage, and frequency control data, for example.

The output circuit 122 buffers the clock signal which is the output signal from the oscillator circuit 121 and outputs the buffered clock signal to the outside of the circuit device 100 from the output terminal TM. For example, the output circuit 122 is constituted with a buffer circuit that buffers a clock signal which is an output signal from the oscillator circuit 121.

The temperature sensors TS1 and TS2 output temperature-dependent voltages that vary depending on the temperature of the environment (for example, the circuit device 100 and the vibrator 110) as temperature detection voltages. For example, the temperature sensors TS1 and TS2 generate a temperature-dependent voltage by using a circuit element having temperature dependency and output the temperature-dependent voltage with reference to a temperature-independent voltage (for example, band gap reference voltage). For example, the temperature sensors TS1 and TS2 output a forward voltage of the PN junction as a temperature-dependent voltage. The temperature detection voltage from the temperature sensor TS2 is input to the selector 10 via the sensor input terminal TTS.

The selector 10 sequentially selects the temperature detection voltages from the temperature sensors TS1 and TS2 and outputs the time-divided temperature detection voltage to the A/D converter 127. The number of temperature sensors included in the vibration device 2 is not limited to 2, and the vibration device 2 may include first to m-th temperature sensors (m is an integer of 1 to n). At this time, the first to n-th voltages may be input to the selector 10, the first to m-th temperature detection voltages from the first to m-th temperature sensors may be input as first to m-th voltages of the first to n-th voltages. The selector 10 sequentially selects the first to n-th voltages and outputs the time-divided temperature detection voltages to the A/D converter 127.

The A/D converter 127 performs A/D conversion on the output voltage of the selector 10. That is, the A/D converter 127 performs A/D conversion on the temperature detection voltages from the temperature sensors TS1 and TS2 which the selector 10 outputs in a time division manner to output the result as time-division temperature detection data. The A/D converter 127 includes the A/D converter circuit 20 and the quantization error hold circuit 30 described in FIG. 1.

The processing circuit 123 (digital signal processing circuit) performs various signal processing. For example, the processing circuit 123 (temperature compensation unit) performs temperature compensation processing for compensating for the temperature characteristics of the oscillation frequency of the vibrator 110 based on the temperature detection data to output frequency control data for controlling the oscillation frequency. Specifically, the processing circuit 123 performs temperature compensation processing for canceling or reducing the fluctuation of the oscillation frequency due to the temperature change (keeping the oscillation frequency constant even in a case where the temperature changes) based on the temperature detection data (temperature-dependent data) that changes in accordance with the temperature and the coefficient data (coefficient data of approximate function) for temperature compensation processing, and the like. The coefficient data for temperature compensation processing is stored in the storage unit 124. The storage unit 124 may be realized by a semiconductor memory such as a RAM (SRAM and DRAM) or may be realized by a non-volatile memory. The processing circuit 123 may be realized by a digital signal processor (DSP) that executes various signal processing including temperature compensation processing in a time division manner. Alternatively, the processing circuit 123 may be realized by an ASIC circuit based on automatic placement and wiring such as a gate array and may be realized by a processor (for example, CPU, MPU, or the like) and a program operating on the processor. In addition, the processing circuit 123 may perform correction processing (for example, aging correction) other than temperature compensation. In addition, the processing circuit 123 may perform heater control (oven control) of the thermostat in an oven controlled crystal oscillator (OCXO), or the like.

The processing circuit 123 includes an interface circuit that performs serial communication with an external device by using a clock signal SCL and a data signal SDA. The interface circuit is an interface circuit such as I2C or SPI, for example. The signal terminals TSC and TSD are terminals for the clock signal SCL and the data signal SDA.

The D/A converter circuit 125 performs D/A conversion on the frequency control data and outputs a control voltage corresponding to the frequency control data to the oscillator circuit 121. In the variable capacitance circuit provided in the oscillator circuit 121, the capacitance value is variably controlled based on this control voltage. In this case, the variable capacitance circuit may be realized by the above-described varactor and the like.

The power supply voltage VDD on a high potential side is supplied to the power supply terminal TV, and the power supply voltage VSS (for example, ground voltage) on a low potential side is supplied to the power supply terminal TG. The circuit device 100 operates by being supplied with the power supply voltages VDD and VSS.

Figure 11:
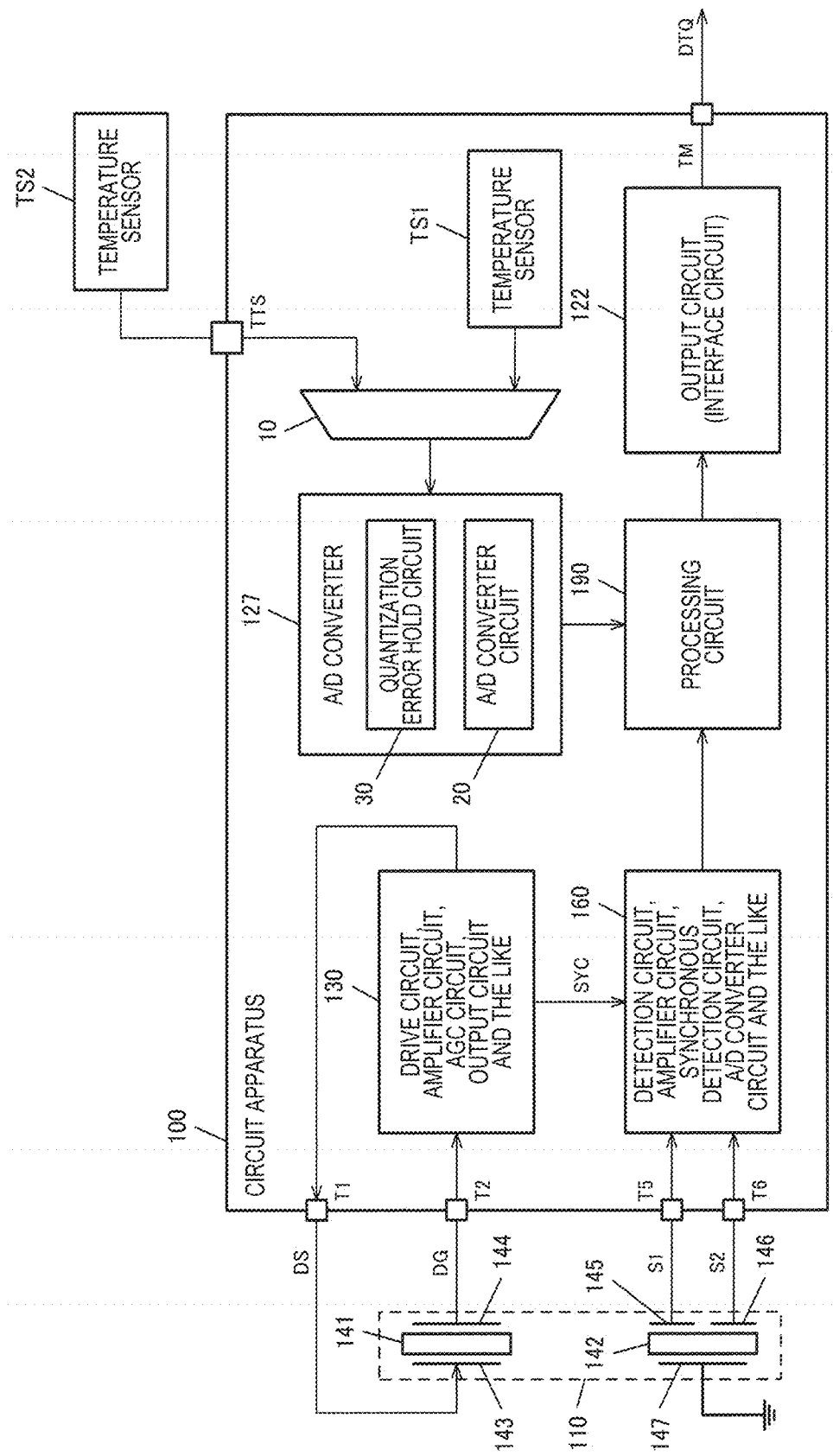
FIG. 11 is a second configuration example of the vibration device including the circuit device.

FIG. 11 shows a second configuration example of the vibration device 2 including the circuit device 100. In FIG. 11, the case where the vibration device 2 is a physical quantity measurement apparatus (physical quantity detection apparatus) for measuring a physical quantity will be described as an example. Various physical quantities such as angular velocity, acceleration, angular acceleration, velocity, distance or time may be assumed as measured physical quantities. In the following, a gyro sensor (vibration gyro sensor) that detects the angular velocity will be described as an example.

The vibration device 2 in FIG. 11 includes the vibrator 110, a circuit device 100, and a temperature sensor TS2. The circuit device 100 includes a drive circuit 130, a detection circuit 160, an output circuit 122, a processing circuit 190, a temperature sensor TS1, the selector 10, an A/D converter 127, terminals T1, T2, T5, and T6, a sensor input terminal TTS, and an output terminal TM.

The vibrator 110 (sensor element and physical quantity transducer) is an element for detecting a physical quantity and includes vibration pieces 141 and 142, drive electrodes 143 and 144, detection electrodes 145 and 146, and a ground electrode 147. The vibration pieces 141 and 142 are piezoelectric vibration pieces formed from a thin plate of a piezoelectric material such as quartz crystal, for example. Specifically, the vibration pieces 141 and 142 are vibration pieces formed of a Z-cut quartz substrate. The piezoelectric material of the vibration pieces 141 and 142 may be a material other than quartz, such as ceramics or silicon.

A drive signal DS (output signal in a broad sense) from the drive circuit 130 of the circuit device 100 is supplied to the drive electrode 143 via the terminal T1, whereby the drive vibration piece 141 vibrates. The vibration piece 141 is, for example, a drive arm of the vibrator 110. A feedback signal DG (input signal in a broad sense) from the drive electrode 144 is input to the drive circuit 130 via the terminal T2. For example, the feedback signal DG resulting from the vibration of the vibration piece 141 is input to the drive circuit 130.

Then, the vibration piece 141 for driving vibrates, whereby the detection vibration piece 142 vibrates. Charges (current) generated by this vibration are input to the detection circuit 160 as detection signals S1 and S2 from the detection electrodes 145 and 146 via the terminals T5 and T6. Here, the ground electrode 147 is set to the ground potential. The detection circuit 160 detects physical quantity information (angular velocity and the like) corresponding to the detection signals S1 and S2 based on these detection signals S1 and S2. Here, the case where the vibrator 110 is a gyro sensor element will be mainly described as an example, but the present embodiment is not limited thereto and the vibrator 110 may be an element for detecting another physical quantity such as acceleration. In addition, as the vibrator 110, for example, a vibration piece having a double T-type structure may be used, but a vibration piece such as a tuning fork type or H type may be used.

The drive circuit 130 may include an amplifier circuit that performs signal amplification by receiving the feedback signal DG from the vibrator 110, an AGC circuit that performs automatic gain control (gain control circuit), an output circuit that outputs the drive signal DS to the vibrator 110, and the like. For example, the AGC circuit variably and automatically adjusts the gain so that the amplitude of the feedback signal DG from the vibrator 110 becomes constant. The AGC circuit may be realized by a full-wave rectifier that performs full-wave rectification of a signal from the amplifier circuit, an integrator that performs integration processing of output signals of the full-wave rectifier, or the like. The output circuit outputs, for example, a rectangular wave drive signal DS. In this case, the output circuit may be realized by a comparator and a buffer circuit. The output circuit may output a sinusoidal drive signal DS. In addition, the drive circuit 130 generates a synchronizing signal SYC based on the output signal of the amplifier circuit, for example, and outputs the signal to the detection circuit 160.

The detection circuit 160 detects the physical quantity information corresponding to the detection signals S1 and S2 based on the detection signals S1 and S2 from the vibrator 110 driven by the drive circuit 130. The detection circuit 160 may include an amplifier circuit, a synchronous detection circuit, an adjustment circuit, and the like. The detection signals S1 and S2 from the vibrator 110 are input to the amplifier circuit via the terminals T1 and T2, and charge-voltage conversion and signal amplification are performed on the detection signals S1 and S2. The detection signals S1 and S2 consist of a differential signal. Specifically, the amplifier circuit may include first Q/V converter circuit that amplifies the detection signal S1, a second Q/V converter circuit that amplifies the detection signal S2, and a differential amplifier that differentially amplifies output signals of the first and second Q/V converter circuits. The synchronous detection circuit performs synchronous detection by using the synchronization signal SYC from the drive circuit 130. For example, synchronous detection for extracting a desired wave from the detection signals S1 and S2 is performed. The adjustment circuit performs offset adjustment for zero-point correction and gain correction for sensitivity adjustment. In addition, the detection circuit 160 includes an A/D converter circuit. The A/D converter circuit performs A/D conversion on the signal after the synchronous detection and outputs digital detection data as a result thereof to the processing circuit 190. In addition, the detection circuit 160 may include a filter circuit that attenuates unnecessary signals that may not be removed by synchronous detection or the like.

The configurations and operations of the temperature sensors TS1 and TS2, the selector 10, and the A/D converter 127 are the same as those in FIG. 10, and the description thereof will be omitted here.

The processing circuit 190 performs various correction processing such as correction processing for offset adjustment and correction processing for sensitivity adjustment based on the detection data from the detection circuit 160. For example, the processing circuit 190 performs zero-point correction processing of a physical quantity (angular velocity) based on temperature detection data from the A/D converter 127. That is, a correction value for canceling (or reducing) the temperature dependency of the zero point is obtained based on the temperature detection data, and the physical quantity is corrected by the correction value.

The output circuit 122 outputs detection data DTQ after the correction processing from the processing circuit 190 to the outside of the circuit device 100 via the output terminal TM. The output circuit 122 in this case may be realized by an interface circuit such as I2C or SPI, for example.

6. Electronic Apparatus

Figure 12:
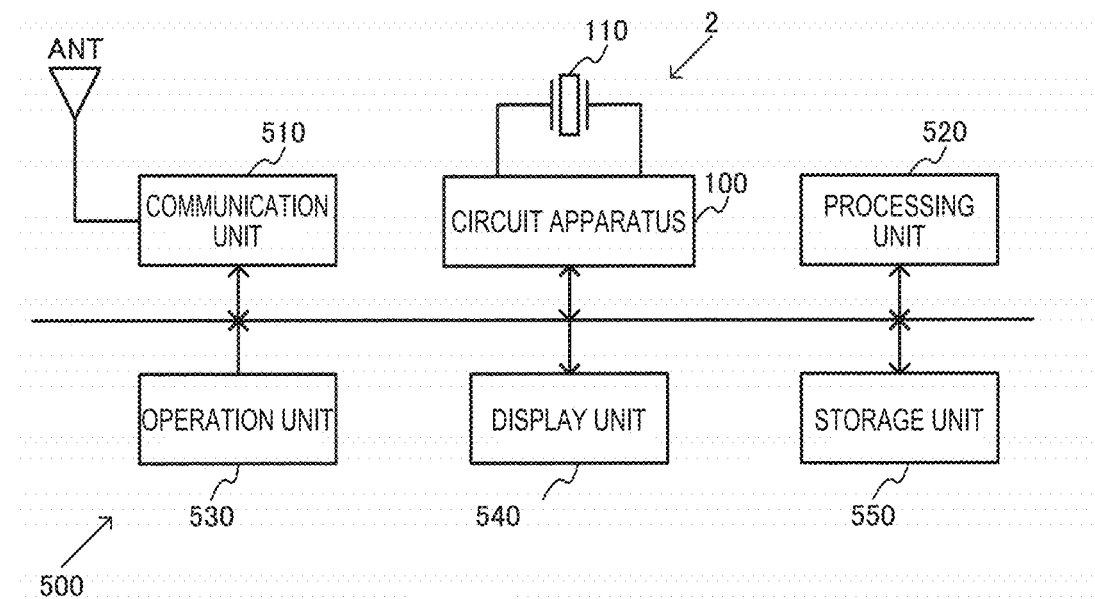
FIG. 12 is a configuration example of an electronic apparatus.

FIG. 12 shows a configuration example of an electronic apparatus 500 including the vibration device 2 (circuit device 100) of the present embodiment. This electronic apparatus 500 includes the vibration device 2 having the circuit device 100 and the vibrator 110, and a processing unit 520. In addition, the electronic apparatus 500 includes a communication unit 510, an operation unit 530, a display unit 540, a storage unit 550, and an antenna ANT.

As the electronic apparatus 500, it is possible to assume network-related equipment such as base stations or routers, high-accuracy measurement equipment that measures physical quantities such as distance, time, flow rate or flow rate, biological information measurement equipment (ultrasonic measurement apparatus, pulse wave meter, blood pressure measurement apparatus, and the like) that measures biological information, in-vehicle equipment (equipment for automatic driving and the like), and the like. In addition, as the electronic apparatus 500, it is possible to assume wearable equipment such as a head mounted type display apparatus or clock related equipment, a robot, a printing apparatus, a projection apparatus, a portable information terminal (smartphone and the like), content providing equipment that distributes content, video equipment such as a digital camera or a video camera, or the like.

The communication unit 510 (communication interface) receives data from the outside via the antenna ANT and performs processing for transmitting data to the outside. The processing unit 520 (processor) performs control processing of the electronic apparatus 500 and various digital processing of data transmitted and received via the communication unit 510. The function of the processing unit 520 may be realized by a processor such as a microcomputer. The operation unit 530 (operation interface) is for the user to perform an input operation and may be realized by an operation button, a touch panel display, or the like. The display unit 540 displays various kinds of information and may be realized by a display such as liquid crystal, organic EL, or the like. The storage unit 550 stores data, and the functions thereof may be realized by a semiconductor memory such as a RAM, ROM, a hard disk drive (HDD), or the like.

Figure 13:
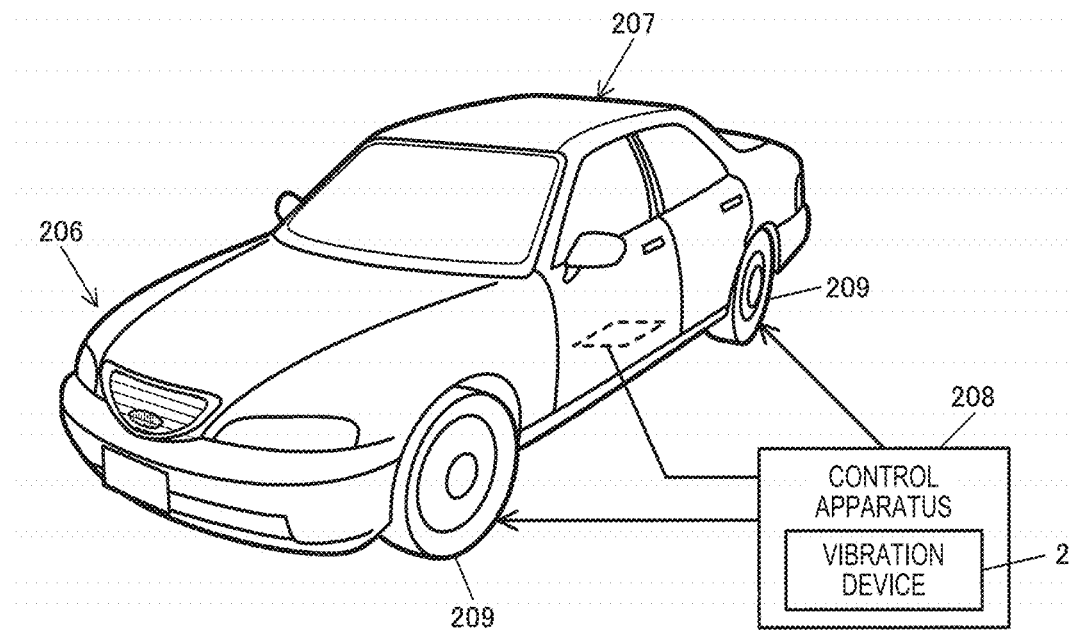
FIG. 13 is an example of a vehicle.

FIG. 13 shows an example of a vehicle including the vibration device 2 (circuit device 100) of the present embodiment. The vibration device 2 (oscillator and physical quantity measurement apparatus) of the present embodiment may be incorporated in various vehicles such as a car, an airplane, a motorbike, a bicycle, a robot, a ship, or the like. The vehicle is an equipment/apparatus that moves on the ground, the sky, or the sea including a drive mechanism such as an engine and a motor, a steering mechanism such as a steering wheel and a rudder, and various kinds of electronic apparatus (in-vehicle equipment). FIG. 13 schematically shows an automobile 206 as a specific example of a vehicle. In the automobile 206, the vibration device 2 of the present embodiment is incorporated. The control apparatus 208 performs various control processing based on the clock signal generated by the vibration device 2 and the measured physical quantity information. For example, in a case where the distance information of the object around the automobile 206 is measured as physical quantity information, the control apparatus 208 performs various control processing for automatic driving by using the measured distance information. The control apparatus 208 controls the hardness of the suspension according to the attitude of a vehicle body 207, for example, or controls the brakes of individual wheels 209. The equipment into which the vibration device 2 of the present embodiment is incorporated is not limited to such a control apparatus 208, and the vibration device 2 may be incorporated in various kinds of equipment provided in a vehicle such as the automobile 206 or a robot.

Although the embodiment has been described in detail as above, but those skilled in the art will easily understand that many modifications may be made without deviating practically from the new matters and effects of the invention. Therefore, all such modification examples are included in the scope of the invention. For example, in the specification or the drawings, terms described with broader or equivalent, but different terms at least once may be replaced with different terms at any point in the description or drawings.

In addition, all combinations of the embodiment and modification examples are included in the scope of the invention. In addition, the configurations, operations, and the like of the circuit device, the vibration device, the electronic apparatus, the vehicle are not limited to those described in the present embodiment, and various modifications may be made.

The entire disclosure of Japanese Patent Application No. 2017-254044, filed Dec. 28, 2017 is expressly incorporated by reference herein.

What is claimed is:

1. A circuit device comprising:
   a selector that receives first to n-th voltages, n being an integer of 2 or more;
   an A/D converter circuit that includes a charge redistribution type D/A converter circuit and receives an output voltage of the selector as an input voltage to perform A/D conversion of the input voltage by a successive approximation operation using the D/A converter circuit; and
   first to n-th quantization error hold circuits that hold charges corresponding to quantization errors in the A/D conversion of the first to n-th voltages,
   wherein the A/D converter circuit uses a charge held in an i-th quantization error hold circuit as a charge corresponding to a quantization error in (k−1)th A/D conversion of an i-th voltage to perform k-th A/D conversion on the i-th voltage, and outputs A/D conversion result data in which the quantization error is noise-shaped, wherein k is an integer of 2 or more and i is an integer from 1 to n.

2. The circuit device according to claim 1,
   wherein the A/D converter circuit includes an adder circuit that outputs a voltage obtained by subtracting a voltage corresponding to the charges held in the i-th quantization error hold circuit from a voltage corresponding to the input voltage,
   the D/A converter circuit outputs a differential voltage between the output voltage of the adder circuit and the D/A converted voltage of successive approximation data, and
   the i-th quantization error hold circuit holds a charge corresponding to the differential voltage after the successive approximation operation for the i-th voltage is completed.

3. The circuit device according to claim 2,
   wherein the A/D converter circuit includes
      a comparator circuit that makes a comparison determination between the output voltage of the adder circuit and the D/A converted voltage of the successive approximation data based on the differential voltage from the D/A converter circuit, and
      a control circuit that updates the successive approximation data based on the comparison result by the comparator circuit to output the successive approximation data to the D/A converter circuit.

4. The circuit device according to claim 2,
   wherein the D/A converter circuit is a differential D/A converter circuit including a capacitor array circuit on a positive electrode side and a capacitor array circuit on a negative electrode side,
   the adder circuit includes
      a fully differential operational amplifier,
      a feedback capacitor on the positive electrode side that is provided between an inverting output node and a non-inverting input node of the operational amplifier, and a feedback capacitor on the negative electrode side that is provided between a non-inverting output node and an inverting input node of the operational amplifier, the i-th quantization error hold circuit includes
    a hold circuit on the positive electrode side and a hold circuit on the negative electrode side, the hold circuit on the positive electrode side includes
    a hold capacitor on the positive electrode side,
    a first switch on the positive electrode side that connects one end of the hold capacitor on the positive electrode side to any one of a sampling node of the capacitor array on the positive electrode side and a node of a common voltage, and
    a second switch on the positive electrode side that connects the other end of the hold capacitor on the positive electrode side to any one of the node of the common voltage and the inverting input node, and the hold circuit on the negative electrode side includes
    a hold capacitor on the negative electrode side,
    a first switch on the negative electrode side that connects one end of the hold capacitor on the negative electrode side to any one of a sampling node of the capacitor array on the negative electrode side and the node of the common voltage, and
    a second switch on the negative electrode side that connects the other end of the hold capacitor on the negative electrode side to any one of the node of the common voltage and the non-inverting input node.

5. The circuit device according to claim 2,
wherein the adder circuit includes
    a fully differential operational amplifier,
    a chopping modulation circuit that performs chopping modulation on voltages input to a non-inverting input node and an inverting input node of the operational amplifier, and
    a chopping demodulation circuit that performs chopping demodulation on voltages output from the inverting output node and the non-inverting output node of the operational amplifier.

6. The circuit device according to claim 1, further comprising:
    a processing circuit that outputs frequency control data based on the A/D conversion result data corresponding to the input voltage which is a temperature detection voltage; and
    an oscillation signal generator circuit that generates an oscillation signal of an oscillation frequency corresponding to the frequency control data by using a vibrator.

7. The circuit device according to claim 1,
wherein first to m-th temperature detection voltages from first to m-th temperature sensors (m is an integer from 1 to n) are input to the selector as first to m-th voltages of the first to n-th voltages.

8. A vibration device comprising:
the circuit device according to claim 1; and
a vibrator that is connected to the circuit device.

9. The vibration device according to 8, further comprising:
    first to m-th temperature sensors (m is an integer of 1 to n),
    wherein first to m-th temperature detection voltages from the first to m-th temperature sensors are input to the selector as first to m-th voltages of the first to n-th voltages.

10. An electronic apparatus comprising:
the circuit device according to claim 1.

11. A vehicle comprising:
the circuit device according to claim 1.

\* \* \* \* \*